(12) United States Patent
Otsuka et al.

(10) Patent No.: US 6,373,136 B2
(45) Date of Patent: Apr. 16, 2002

(54) DAMASCENE WIRING STRUCTURE AND SEMICONDUCTOR DEVICE WITH DAMASCENE WIRINGS

(75) Inventors: Satoshi Otsuka; Akira Yamanoue, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/735,478

(22) Filed: Dec. 14, 2000

(30) Foreign Application Priority Data

Apr. 14, 2000 (JP) ........................................ 2000-113286

(51) Int. Cl.[7] ...................... H01L 23/48; H01L 21/4763
(52) U.S. Cl. ...................... 257/758; 257/760; 257/773; 438/624
(58) Field of Search ............................. 257/758, 760, 257/773; 438/622, 624, 629, 637

(56) References Cited

U.S. PATENT DOCUMENTS

| | | | | |
|---|---|---|---|---|
| 5,602,423 A | * | 2/1997 | Jain | 257/752 |
| 5,834,845 A | * | 11/1998 | Stolmeijer | 257/752 |
| 5,920,790 A | * | 7/1999 | Wetzel et al. | 438/618 |
| 6,093,632 A | * | 7/2000 | Lin | 438/618 |
| 6,204,110 B1 | * | 3/2001 | Roberts | 438/238 |

FOREIGN PATENT DOCUMENTS

| | | |
|---|---|---|
| JP | 5-152299 | 6/1993 |
| JP | 8-64771 | 3/1996 |
| JP | 8-213397 | 8/1996 |
| JP | 9-213696 | 8/1997 |
| JP | 9-306908 | 11/1997 |

* cited by examiner

Primary Examiner—T. N. Quach
(74) Attorney, Agent, or Firm—Armstrong, Westerman & Hattori, LLP

(57) ABSTRACT

A damascene wiring structure having: a lower wiring structure; an interlayer insulating film covering the lower wiring structure; a wiring trench formed in the interlayer insulating film from an upper surface thereof, and a via hole passing through the interlayer insulating film from a lower surface of the wiring trench in an inner area thereof and reaching the lower wiring structure, the via hole having a diameter smaller than a width of the wiring trench; an insulating pillar pattern projecting upward from the lower surface of the wiring trench in an area outside of the via hole, the insulating pillar pattern being made of a same material as the interlayer insulating film, wherein a first occupied area factor of the insulating pillar pattern in a first area of the wiring trench near said via hole is higher than a second occupied area factor of the insulating pillar pattern in a second area of the wiring trench remote from the via hole; and a dual damascene wiring formed by filling the wiring trench and said via hole with conductive material. A damascene wiring structure having a high reliability and a semiconductor device having such a damascene wiring structure can be formed.

20 Claims, 21 Drawing Sheets

FIG. IA
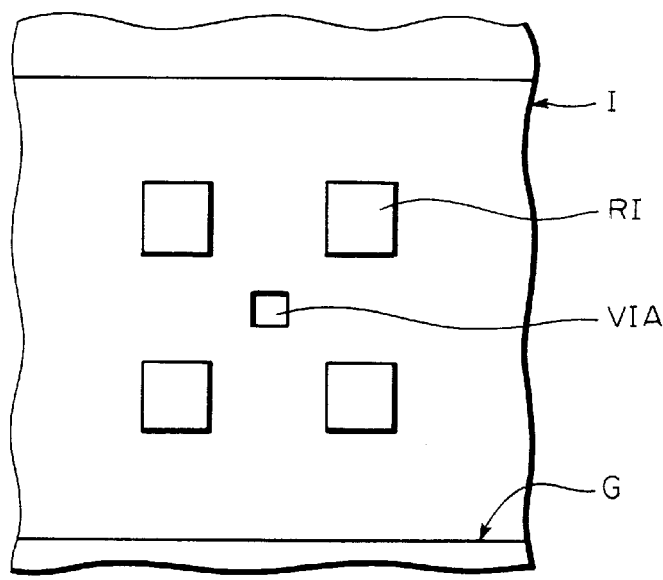
FIG. IB
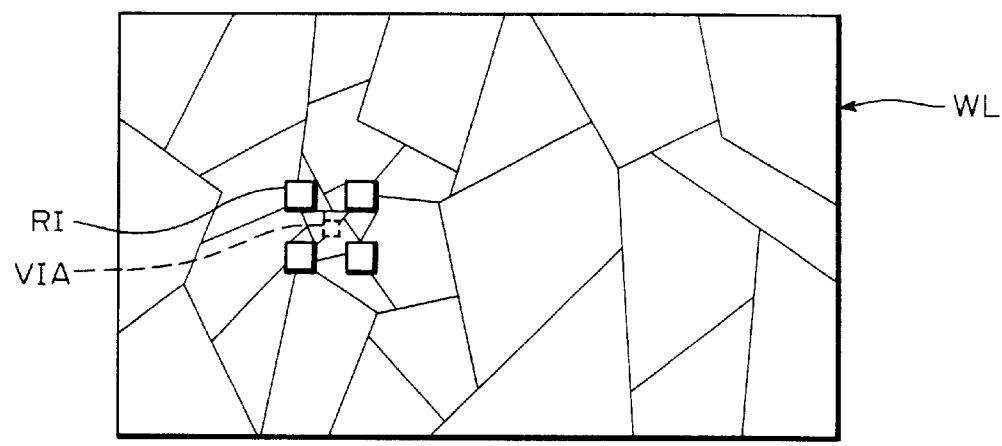
FIG. IC
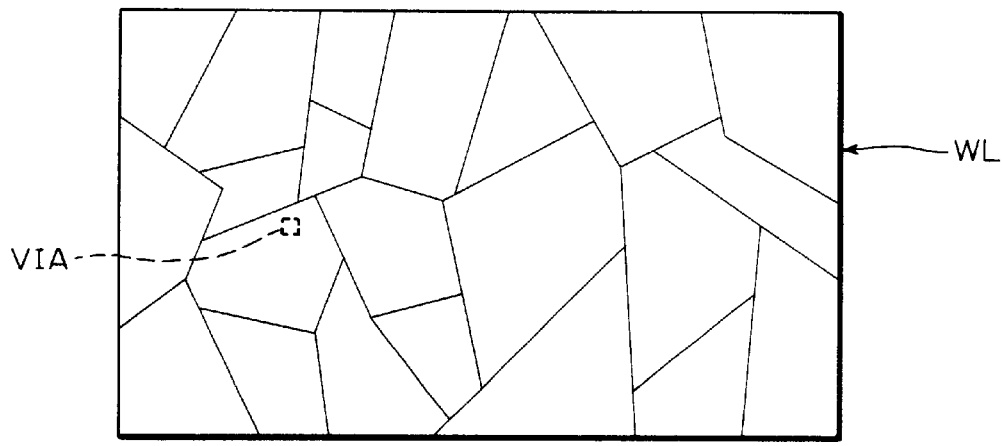

NUMBER OF LOOPS OF RESIDUAL PATTERNS

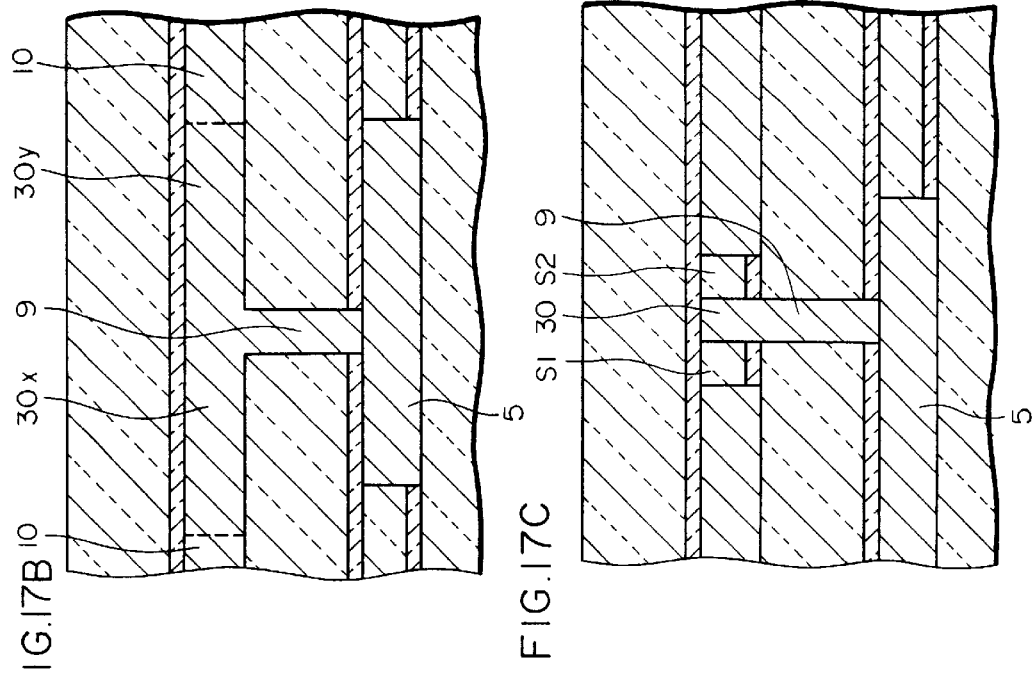
FIG.17B
FIG.17C
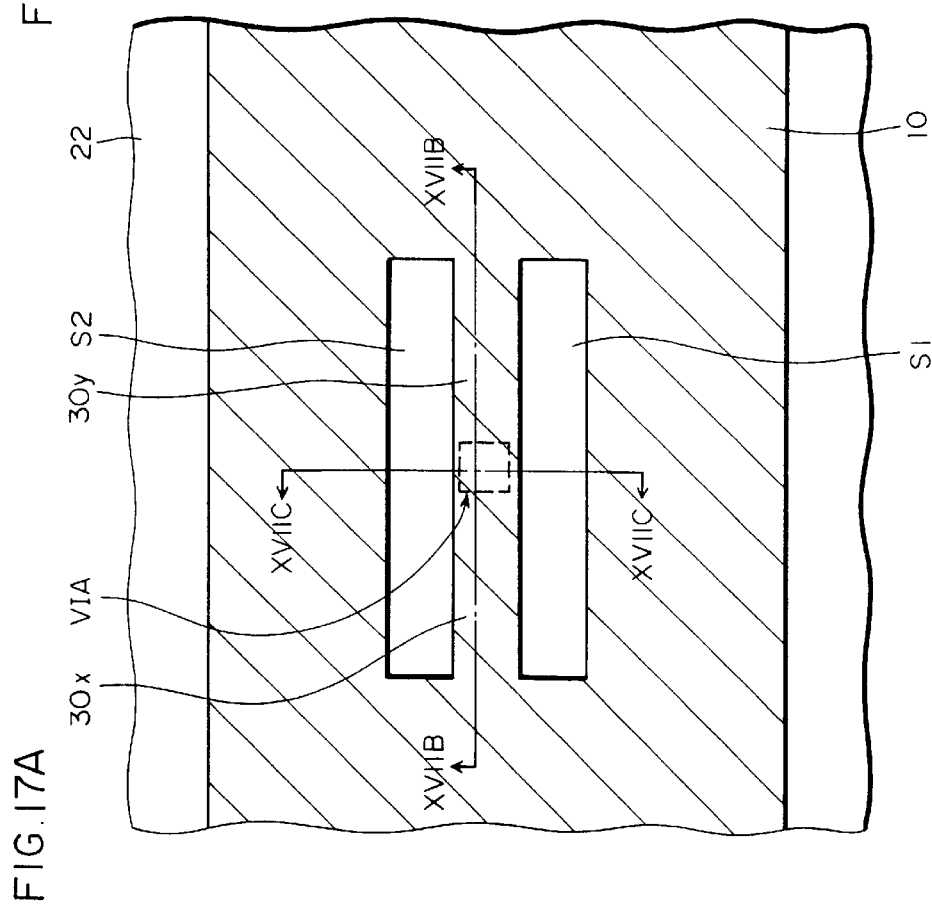
FIG.17A

DAMASCENE WIRING STRUCTURE AND SEMICONDUCTOR DEVICE WITH DAMASCENE WIRINGS

This application is based on Japanese Patent Application 2000-113286, filed on Apr. 14, 2000, the entire contents of which are incorporated herein by reference.

BACKGROUND OF THE INVENTION a) Field of the Invention

The present invention relates to a wiring structure and a semiconductor device with a wiring structure, and more particularly to a damascene wiring structure and a semiconductor device having a damascene wiring structure.

b) Description of the Related Art

Al or Al alloy is often used as a metal wiring material of semiconductor devices. Al and Al alloy have a low resistivity, and are easy to be patterned by using a photoresist mask and etchant gas.

Wiring material having a lower resistivity and a higher allowable current density is desired in order to meet requirements for micro patterns and high speed operation of recent semiconductor devices. Attention has been paid to Cu as such wiring material. If a Cu wiring layer is etched, this etching generates corrosion because of influence of etchant and water contents. Patterning using a photoresist mask and etchant is, therefore, not suitable for a Cu wiring layer. A damascene process is used for patterning a Cu wiring layer (or wiring pattern). A Cu wiring layer is buried in a preformed trench and thereafter an unnecessary area is removed by polishing.

In order to connect a lower level wiring and an upper level wiring, a via conductor is used which is buried in a via hole formed through the interlayer insulating film. If the via conductor and the upper level wiring are formed by different processes, a total process time prolongs. In order to shorten the total process time, a dual damascene process is adopted. With this process, metal is buried or embedded in a trench defined by a via hole formed between multi-layer wirings and a trench for the upper wiring, and thereafter polished to leave the metal only in the trench.

The dual damascene process applied to a Cu wiring layer is, however, associated with wiring defects such as wiring disconnection.

FIGS. 20A to 20D show examples of wiring defects formed when a conventional Cu dual damascene process is used.

FIG. 20A shows an example of a Cu multi-layer wiring structure. A narrow lower wiring layer trench is formed in a lower level insulating film 104, and a Cu lower wiring 105 is formed in this lower wiring trench. For example, after a barrier metal layer and a seed metal layer are deposited by sputtering, a Cu wiring layer is formed thereon by electrolytic plating. Cu deposited on the upper surface of the lower insulating film 104 is removed by chemical mechanical polishing (CMP). After the lower level wiring 105 is formed, an interlevel insulating film is deposited, the insulating film being a lamination of an SiN layer 106, an $SiO_2$ layer 107, an SiN layer 116 and an $SiO_2$ layer 117. In this interlayer insulating film, a via hole 108 for connection of wirings is formed. After the via hole 108 is buried or filled with resist or the like, the $SiO_2$ layer 117 and SiN layer 116 are selectively removed to form a wide upper wiring layer trench.

After the upper wiring layer trench and via hole 108 are exposed, a via conductor 109 and an upper wiring 110 are formed by the same conductive layer forming process. For example, after a barrier metal layer is deposited by sputtering, a Cu wiring layer is formed on the barrier metal layer by electrolytic plating. Cu deposited on the surface of the $SiO_2$ layer 117 is removed through polishing. In this manner, a dual damascene wiring DD made of the via conductor 109 and upper wiring 110 can be formed. After the upper wiring 110 is formed, an upper insulating layer is formed on the surface of the dual damascene wiring, the upper insulating film being a two-layered film of an SiN layer 111 and an $SiO_2$ layer 112.

A multi-layer wiring structure of Cu wirings is formed in this manner. The via conductor 109 for connection of wirings is made of the same material as the upper wiring 110.

Such a multi-layer wiring structure may have wiring defects such as wiring disconnection. The wiring defects such as disconnection are often formed in the via conductor in the via hole or the lower Cu wiring near the via hole.

FIG. 20B is a schematic diagram showing the structure of a wiring defect with a void 120 being formed in the middle of the via hole 108. This void 120 formed in the middle of the via hole 108 electrically disconnects the lower wiring 105 and upper wiring 110.

FIG. 20C is a schematic diagram showing the structure of a wiring defect with a void 120 being formed on the bottom of the via hole 108. Although the position of the void 120 is different, the lower wiring 105 and upper wiring 110 are electrically disconnected. A void is formed not only in the via hole but also between the via conductor and lower wiring.

FIG. 20D is a schematic diagram showing a void 120 formed in the lower wiring in the connection area between the via conductor 109 and lower wiring 105. This void 120 formed in the contact area with the lower wiring 105 electrically disconnects the lower wiring 105 and via conductor 109.

In the multi-layer wiring structure formed by the dual damascene process, a void which causes wiring defects is often formed in the via conductor or in the surface layer of the lower wiring in the contact area with the via conductor. It is desired to avoid such wiring defects in order to form a highly reliable multi-layer wiring structure.

As above, it is known that if the dual damascene structure is applied to the multi-layer wiring structure of Cu, wiring defects are generated and the reliability is lowered.

SUMMARY OF THE INVENTION

It is an object of the present invention to provide a highly reliable damascene wiring structure and a semiconductor having such a damascene wiring structure.

It is another object of the present invention to provide a multi-layer wiring structure capable of shortening a total process time and preventing a void from being formed and a semiconductor device having such a multi-layer wiring structure.

According to one aspect of the present invention, there is provided a damascene wiring structure, comprising: a lower wiring structure; an interlayer insulating film covering the lower wiring structure; a wiring layer trench formed in the interlayer insulating film from an upper surface thereof, and a via hole passing through the interlayer insulating film from a lower surface of the wiring trench in an inner area thereof and reaching the lower wiring structure, the via hole having a diameter smaller than a width of the wiring layer trench;

an insulating pillar pattern projecting upward from the lower surface of the wiring layer trench in an area outside of the via hole, the insulating pillar pattern being made of a same material as the interlayer insulating film, wherein a first occupied area factor of the insulating pillar pattern in a first area of the wiring layer trench near to the via hole is higher than a second occupied area factor of the insulating pillar pattern in a second area of the wiring layer trench remote from the via hole; and a dual damascene wiring formed by filling the wiring layer trench and the via hole with conductive material.

According to another aspect of the invention, there is provided a semiconductor device, comprising: a semiconductor substrate; an integrated circuit structure formed on the semiconductor substrate; a multi-layer wiring structure formed above the integrated circuit structure; and a number of pads formed on the semiconductor substrate, wherein the multi-layer wiring structure comprises: a lower wiring structure; an interlayer insulating film covering the lower wiring structure; a wiring layer trench formed in the interlayer insulating film from an upper surface thereof, and a via hole passing through the interlayer insulating film from a lower surface of the wiring trench in an inner area thereof and reaching the lower wiring structure, the via hole having a diameter smaller than a width of the wiring layer trench; an insulating pillar pattern projecting upward from the lower surface of the wiring layer trench in an area outside of the via hole, the insulating pillar pattern being made of a same material as the interlayer insulating film, wherein a first occupied area factor of the insulating pillar pattern in a first area of the wiring layer trench near to the via hole is higher than a second occupied area factor of the insulating pillar pattern in a second area of the wiring layer trench remote from the via hole; and a dual damascene wiring formed by embedding the wiring layer trench and the via hole with conductive material.

With these structures described above, a diameter of crystal grains in the upper wiring above the via hole becomes small so that stress migration can be suppressed and wiring disconnections can be reduced.

Wiring defects to be caused by stress migration can be suppressed even if a wide wiring is formed by using the dual damascene process.

A highly reliable semiconductor device can be manufactured with a high manufacture yield.

BRIEF DESCRIPTION OF THE DRAWINGS

FIGS. 1A, 1B and 1C are a plan view and sketches showing a distribution of crystal gains in a wiring, respectively for illustrating fundamental embodiments of the invention.

FIGS. 17A, 17B and 17C are a plan view and cross sectional views of a wiring structure according to an embodiment of the invention.

DETAILED DESCRIPTION OF THE PREFERRED EMBODIMENTS

The present inventors have studied why voids are formed in a Cu multilayer wiring structure.

Figure 2A:
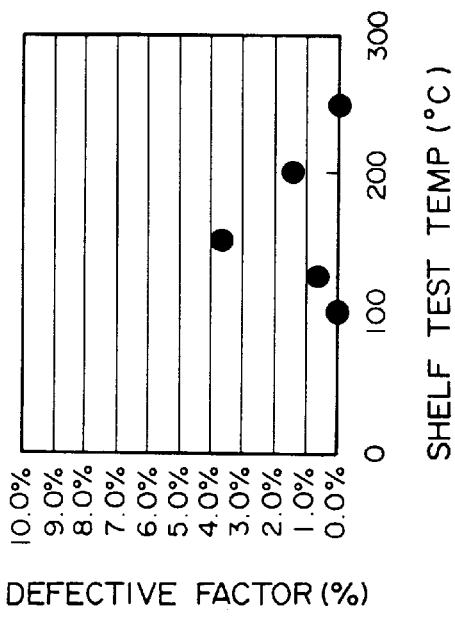
FIG. 2A to 2D are a plan view, a cross sectional view and graphs illustrating experiments made by the present inventors.
Figure 2C:
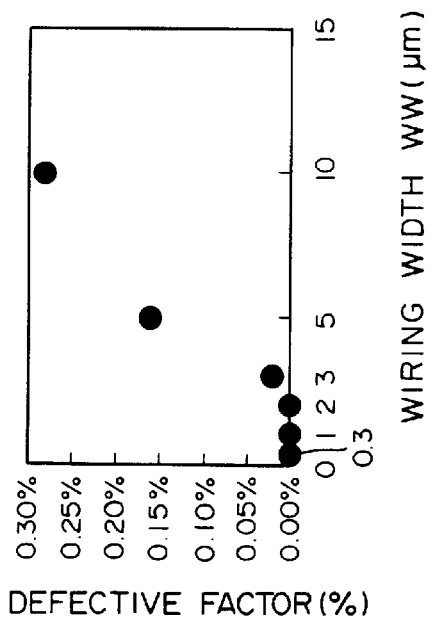
Figure 2B:
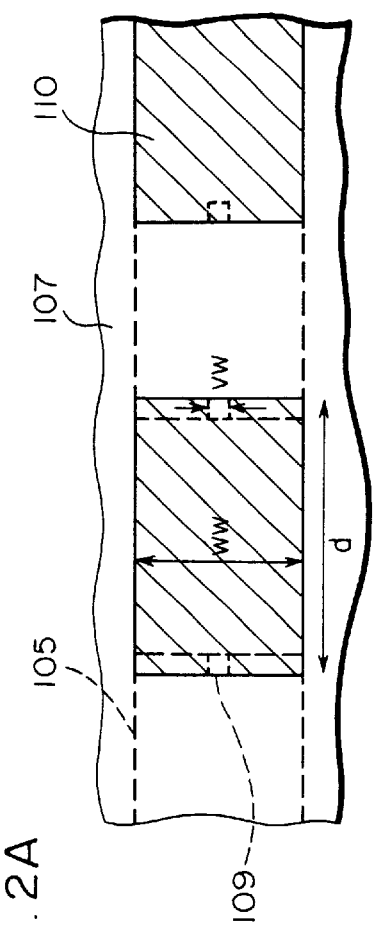

FIGS. 2A and 2B show the structure of a sample used by the experiments made by the present inventors. FIG. 2A is a plan view of the sample and FIG. 2B is a cross sectional view of the sample.

As shown in FIG. 2B, a wiring layer trench G1 having a depth of about 0.45 $\mu$m is formed in a surface layer of a lower insulating film 104. A lower wiring 105 is formed by filling the wiring layer trench G1. This lower wiring 105 is formed on a silicon oxide film having a thickness of about 0.5 $\mu$m formed on an Si substrate surface. In forming a wiring layer, a TaN barrier metal layer is formed by sputtering to a thickness of about 30 nm and a seed metal layer is formed by sputtering to a thickness of 100 nm, thereafter the trench is buried or embedded with Cu by electrolytic plating, and then an unnecessary wiring layer formed on the upper surface of the lower wiring layer is removed by chemical mechanical polishing (CMP).

An experimental sample was used for forming a number of via chains so that islands of the lower wiring layer 105 were formed disposed at a constant interval.

An interlayer insulating film 107 is formed on the lower wiring layer 105. Via holes and upper wiring layer trenches G2 are formed in the interlayer insulating film 107, and an upper wiring layer 110 and a via conductor 109 are formed by a dual damascene process same as the wiring layer forming process described earlier. The conductive layer formed on the upper surface of the interlayer insulating film 107 is removed by CMP or the like.

The dual damascene wiring layer is made of a TaN layer having a thickness of about 30 nm and a Cu layer formed thereon. A thickness of the upper level wiring layer is about 0.45 μm, and a height of the via hole is about 700 nm. The number of via chains is about 2000 vias.

FIG. 2A is a schematic plan view showing the structure of the sample after the upper wiring 110 is formed. The upper wiring 110 has, for example, a width ww of 10 μm and a length d of 20 μm. Such rectangular upper wirings 110 are repetitively disposed. The lower wiring 105 has the same width as the width ww of the upper wiring. Such lower wirings 105 are repetitively disposed with their end portions being overlapped with those of the upper wirings 110.

The ends of the via conductor 109 coincide with the overlapped area of the upper and lower wirings 110 and 105. A width vw of the via conductor 109 is designed to be considerably narrower than the width ww of the upper and lower wirings 110 and 105. As compared to the width of about 10 μm of the upper and lower wirings 110 and 105 of the sample, the width or diameter vw of the via conductor 109 is about 0.3 μm. In the measurement sample, such via chains of about 1000 (2000 vias) are formed.

FIG. 2C is a graph showing the measurement results of defective factors of a number of via chains formed on the sample under a high temperature shelf test, with the width ww of the upper and lower wirings 110 and 105 being set to 10 μm.

The abscissa represents a shelf test temperature in °C. and the ordinate represents a defective factor in %. The shelf test time was set to 168 hours (one week). There is a clear peak value of the defective factor in the shelf test temperature range from 100° C. to 250° C. Although the defective factor is approximately 0% at shelf test temperatures of 100° C. and 250° C., the defective factor increases in the shelf test temperature range from 125° C. to 200° C. and there is a temperature at which the peak defective factor appears. In the graph shown in FIG. 2C, the peak defective factor is near at the shelf test temperature of about 150° C.

Such characteristics are inherent to stress migration. It can be understood that stress migration is likely to occur if the dual damascene structure is used.

Stress migration is a phenomenon that stresses are generated in a metal wiring in a temperature range from a room temperature to a shelf test high temperature, because of a thermal expansion coefficient difference between the metal wiring and an interlayer insulating film, and that metal (Cu) atoms in the wiring are forced to migrate by the stresses. For example, a metal wiring receives a compression stress at a high temperature and receives an expansion stress at a low temperature. When the metal line receives such stresses, it is broken along a weak tolerance area.

Figure 2D:
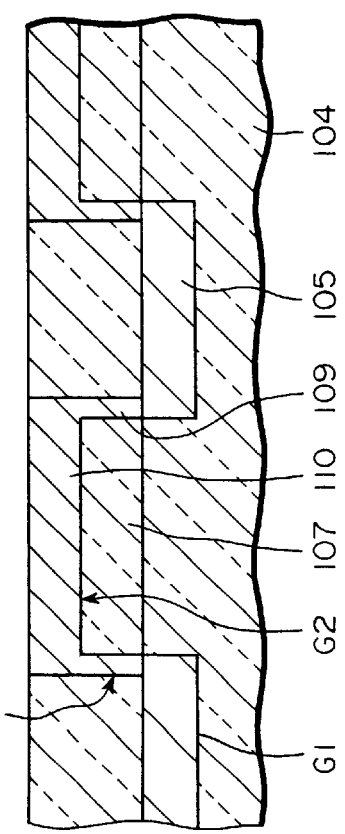

It has been found from the experiment results shown in FIG. 2C that generation of wiring defects largely depends upon stress migration. Next, how the wiring width of the upper and lower wirings influences the wiring defects which may be ascribed to stress migration, has been checked. The experiment results are shown in FIG. 2D. The width ww of the wiring was used as parameters and set to 0.3 μm, 1 μm, 2 μm, 3 μm, 5 μm and 10 μm, and the via diameter was fixed to 0.3 μm.

The experiment results shown in FIG. 2D show that the defective factor increases greatly as the width of the wiring increases. In the wiring width range of about 2 μm or narrower, the defective factor is almost 0. However, as the wiring width becomes wider than 2 μm, the defective factor increases. In particular, as the wiring width exceeds 5 μm, the defective factor takes a large value. In this specification, a wiring having a width wider than 2 μm is called a wide wiring. The wide wiring is typically in the width range not narrower than 3 μm and more typically in the width range not narrower than 5 μm.

It can be known from the experiment results that as the width of the wide wiring connected to a small diameter via hole increases, the defective factor increases. Since the defective factor is about 0% if the wiring width ww is about 2 μm or narrower, it can be known that the defective factor lowers considerably if the width of the wide wiring is about seven times the via hole diameter or narrower.

As the width ww of the wide wiring becomes about seven times the via hole diameter vw or wider, the defective factor increases. If the width of the wide wiring becomes larger, particularly, about 5 μm or larger, the defective factor becomes about 0.15% or higher.

In the sample shown in FIGS. 2A and 2B, the via hole is formed in the end area of the wide wiring. How the defective factor depends on the distance of the via hole from the end of a wide wiring, has been studied next.

Figure 3A:
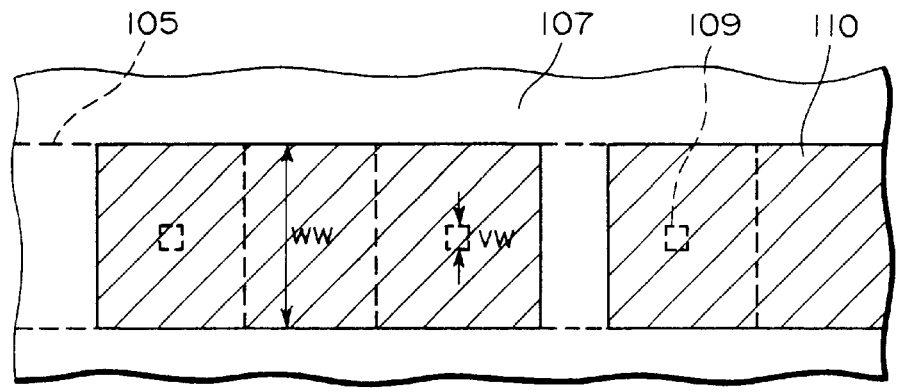
FIG. 3A, 3B and 3C are a plan view, a cross sectional view and a graph illustrating experiments made by the present inventors.
Figure 3B:
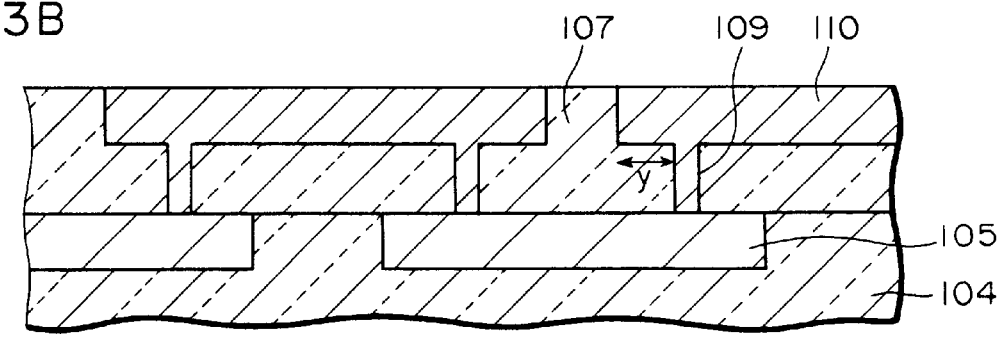

FIGS. 3A and 3B are a plan view and a cross sectional view showing the structure of a sample used. Similar to the sample shown in FIGS. 2A and 2B, a lower wiring 105 is formed on a silicon oxide film having a thickness of about 0.5 μm by a damascene process.

An interlayer insulating film 107 is formed on a lower insulating film 104, and an upper wiring layer trench is formed in, and a via hole is formed through, through the interlayer insulating film 107. An upper wiring 110 and a via conductor 109 are formed by a dual damascene process.

In this sample, the via hole is formed at a distance y from the end of the upper wiring 110. A sample having the distance y of 0 μm and a sample having the distance y of 5 μm were formed. The other points are similar to those of the sample shown in FIGS. 2A and 2B.

Figure 3C:
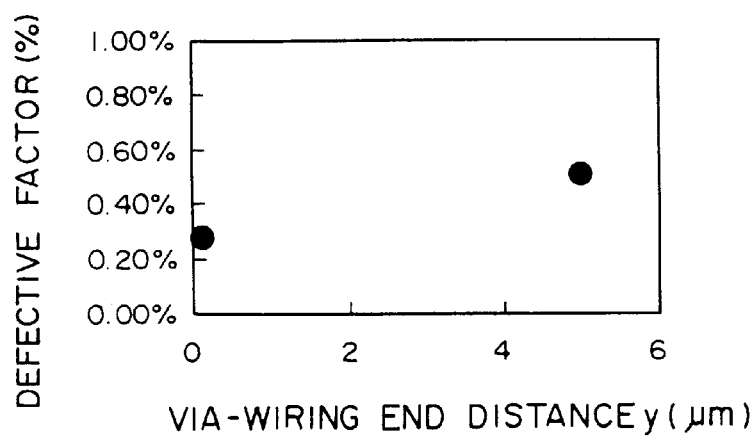

FIG. 3C is a graph showing a defective factor as a function of the distance of the via hole from the end of the upper wiring. The abscissa represents a distance y between the via hole and the end of the upper wiring in μm, and the ordinate represents a defective factor in %.

At the distance y of 0, the defective factor was about 0.28% the same as that shown in FIG. 2D. At the distance y of 5 μm, the defective factor increased to about 0.5%. It can be expected from this results that the better defective factor is obtained as the via hole is formed as near to the end of the upper wiring as possible. The end of the wiring corresponds to an interface with the insulating film. It can be considered that this insulating film has some influence upon the defective factor.

Figure 4:
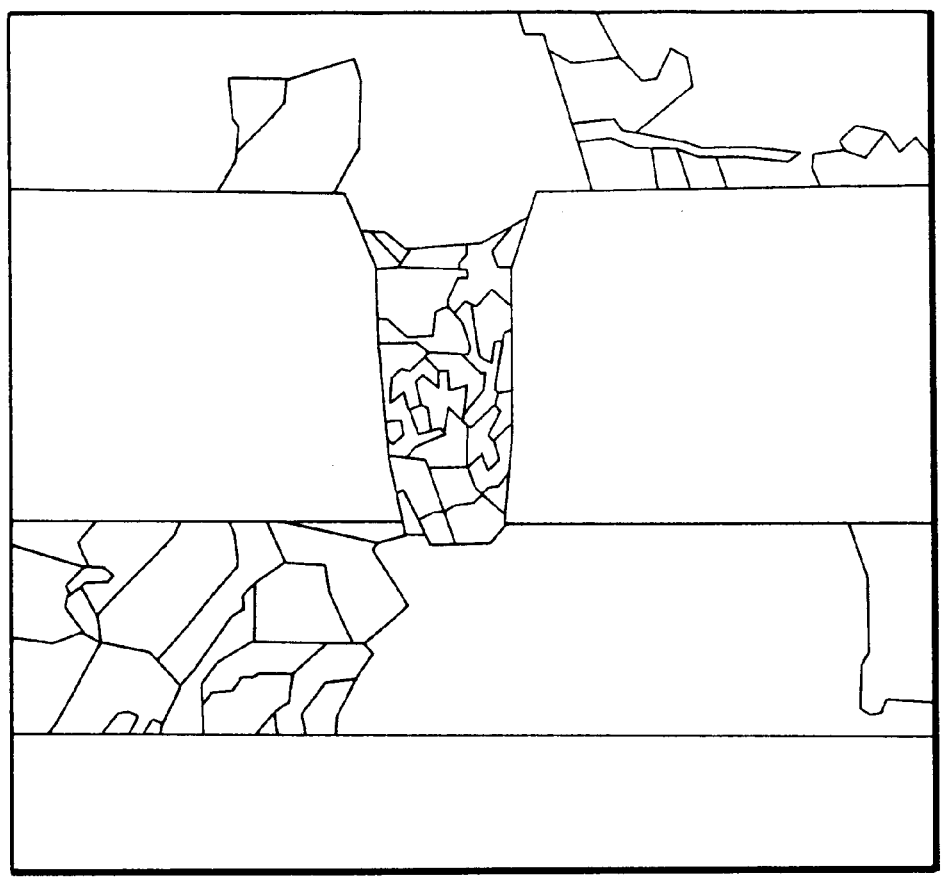
FIG. 4 is a sketch of a transmission type electron microscopic photograph of a sample used in the experiments illustrated in FIGS. 3A to 3C.

FIG. 4 is a sketch of a transmission type electron microscopic photograph showing the cross section of the sample shown in FIGS. 3A and 3B. It can be observed that although the upper and lower wirings are made of crystal grains having generally the same grain diameter, the conductor in the via hole is made of crystal grains having a grain diameter considerably smaller than that in the upper and lower wirings.

Figure 20A:
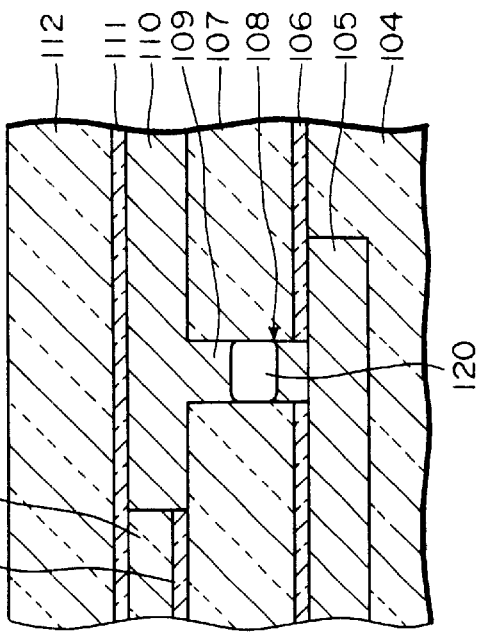
FIGS. 20A to 20D are cross sectional views illustrating conventional techniques.
Figure 20B:
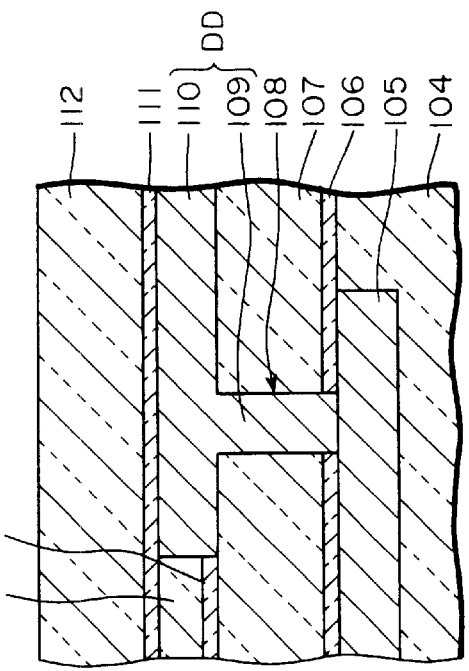
Figure 20C:
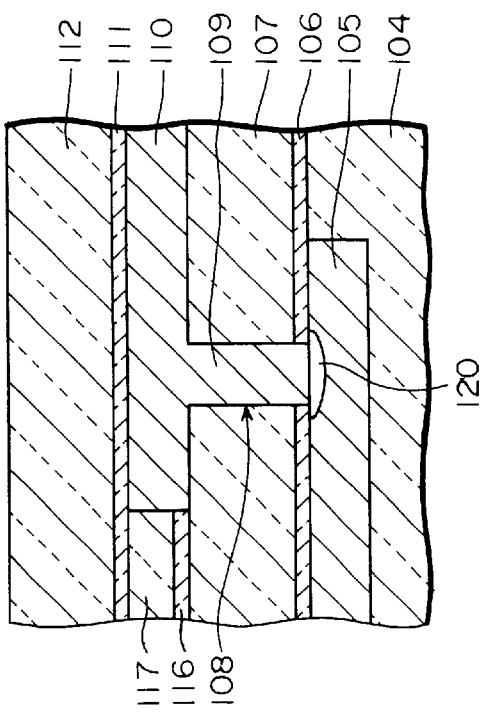
Figure 20D:
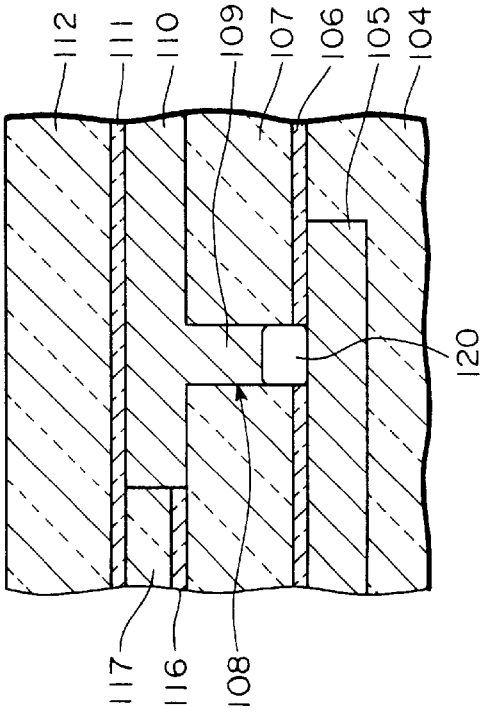

The surface energy of each crystal grain is different because the diameter of each crystal grain is different between the via conductor and the upper wiring (lower wiring) continuous with the via conductor. It can be considered that even after the dual damascene wiring is formed, migration occurs from smaller diameter crystal grains to larger diameter crystal grains in order to stabilize surface energies, and crystal growth progresses. As migration occurs from smaller diameter crystal grains to larger diameter crystal grains, atoms in the via conductor having many smaller diameter crystal grains migrate and a void is formed. With such migration of conductor atoms, voids such as shown in FIGS. 20B to 20D may be formed.

Although both the upper and lower wirings of the sample are made of wide wirings, one of the upper and lower wirings may be a wide wiring in a practical semiconductor device.

If lower wirings are narrow and high density wirings, it is difficult to set the via hole diameter larger from the viewpoint of short circuit prevention and parasitic capacitance reduction. A via hole is generally designed to have the diameter same as the width of a narrow wiring. Generally the via hole has a diameter of 1 μm or smaller which is often the same as the minimum line width.

Power supply lines, clock signal lines and the like are desired to use wide wirings so as to realize low resistance. Larger diameter crystal grains grow in a wide wiring. In order to prevent the generation of a void, it can be considered effective to reduce migration from the via conductor to the wide wiring.

FIG. 1A is a schematic plan view showing a via hole and an upper wiring layer trench used for a dual damascene wiring structure according to an embodiment of the invention. An upper wiring layer trench G is formed in an interlayer insulating film I, and a via hole VIA is formed through the interlayer insulating film I in a contact area with a lower wiring. The diameter of the via hole VIA is considerably smaller than the width of the upper wiring layer trench G. Residual patterns RI of the interlayer insulating film I are formed surrounding the via hole VIA.

Narrow areas defined by the residual patterns RI are interposed between the via hole VIA and wide wiring. Since the peripheral area of the via hole VIA is substantially surrounded by the distributively disposed residual patterns RI, narrow phantom wirings are formed in this area. It is therefore expected that the diameters of crystal grains in this area are small. The residual pattern RI does not work as wiring and hence is preferably shaped in pillar-like configuration with small cross-sectional area. Thus, it will also be called "pillar".

FIG. 1B is a sketch of the surface of a dual damascene wiring formed by using the interlayer insulating film shown in FIG. 1A. It can be seen that the diameters of crystal grains in the area surrounded by the residual patterns RI are considerably different from those in the wide wiring area.

FIG. 1C is a sketch showing a distribution of grain diameters on the surface of the wide upper wiring connected to a via conductor and not formed with the residual patterns RI of the interlayer insulating film. It can be seen that larger diameter crystal grains are formed also above the via hole VIA and that the wide wiring WL is made of crystal grains having generally uniform diameters. In this case, the diameters of crystal grains in the conductor in the via hole VIA are considerably smaller than those in the wide wiring WL, which may be ascribed to stress migration described earlier.

In the structure shown in FIG. 1B, it is expected that since the diameters of crystal grains in the upper wiring above the via hole VIA are small, stress migration of atoms moving from the conductor in the via hole VIA to the wide wiring WL can be suppressed.

Figure 5A:
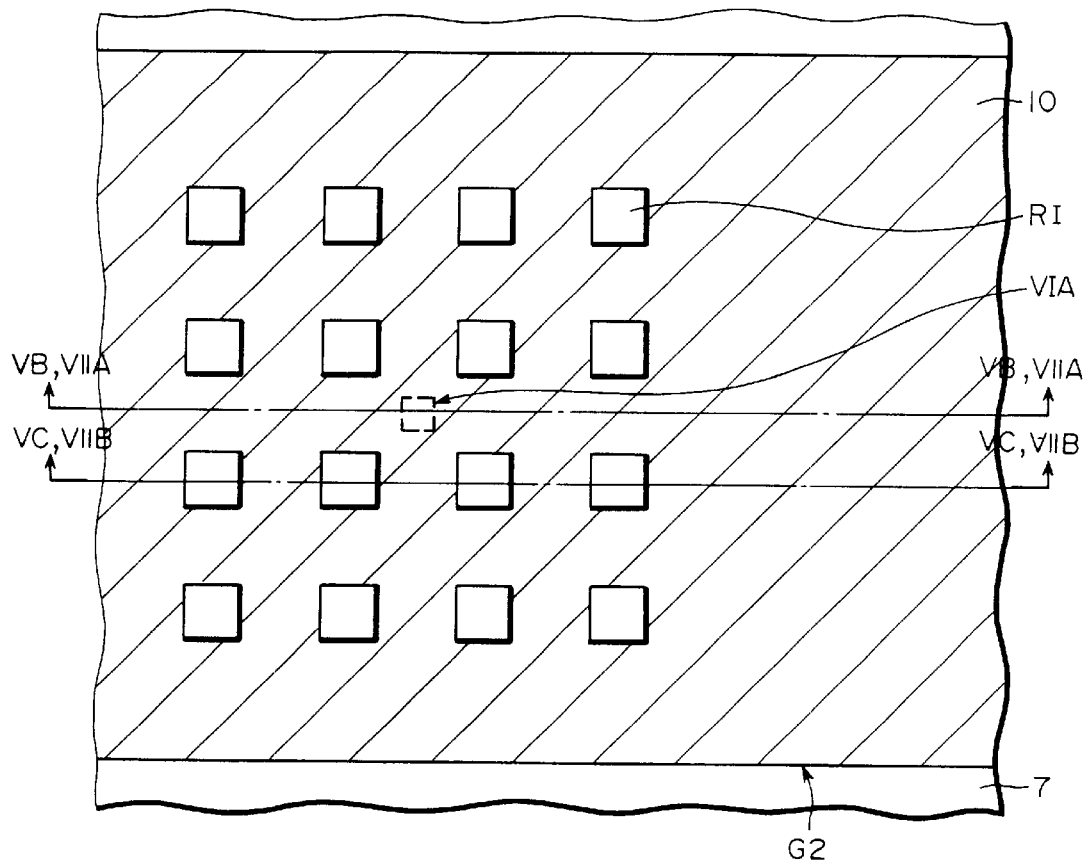
FIGS. 5A, 5B and 5C are a plan view and cross sectional views illustrating a wiring structure according to an embodiment of the invention.
Figure 5B:
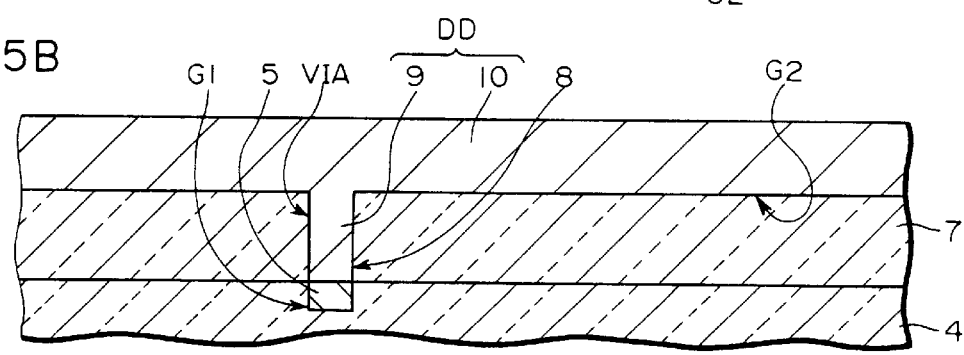
Figure 5C:
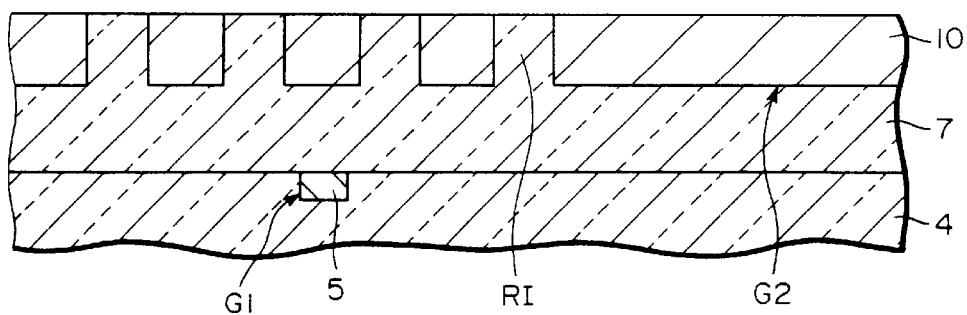

FIGS. 5A, 5B and 5C are a plan view and cross sectional views showing the structure of a more specific dual damascene wiring. FIG. 5B is a cross sectional view taken along line VB—VB shown in FIG. 5A, and FIG. 5C is a cross sectional view taken along line VC—VC shown in FIG. 5A.

As shown in FIGS. 5B and 5C, a narrow lower wiring layer trench G1 is formed in the surface layer of a lower level insulating film 4 through etching. After a barrier metal layer of TaN or the like is formed by sputtering, a Cu layer as a principal wiring layer is formed by electrolytic plating. The main wiring layer and barrier metal layer on the upper surface of the lower insulating film are removed by CMP. A lower wiring 5 is therefore formed.

An interlayer insulating film 7 is formed on the lower insulating film 4, covering the lower wiring 5. A via hole VIA is formed from the surface of the interlayer insulating film to the surface of the lower wiring 5. In an area containing the via hole VIA, an upper wiring layer trench G2 is formed.

As shown in FIG. 5A, residual patterns RI of the interlayer insulating film not used for defining the upper wiring layer trench G2 are formed surrounding the via hole VIA. In the example shown in FIG. 5A, inner four residual patterns RI and outer twelve residual patterns RI are formed surrounding the via hole VIA. For example, each residual pattern RI is a square having a side length of 0.5 μm, and the patterns RI are disposed at a pitch of 1.2 μm (a space between adjacent residual patterns is 0.7 μm).

As shown in FIGS. 5B and 5C, a barrier metal layer is formed by sputtering, burying the upper wiring layer trench G2 and via hole VIA, and a Cu layer is formed thereon by electrolytic plating. The wiring layer formed on the upper surface of the interlayer insulating film 7 is removed by CMP. An upper wiring 10 is therefore patterned and the surfaces of the interlayer insulating film 7 and residual patterns RI are exposed. The upper surface of the dual damascene wiring becomes as shown in FIG. 5A.

The cross sectional view of FIG. 5B is similar to a conventional damascene wiring. However, the cross sectional view of FIG. 5C shows the residual patterns RI of the interlayer insulating film distributed generally at an equal pitch. Therefore, the upper wiring 10 becomes narrow phantom wirings in an area near the via hole VIA.

In the example shown in FIG. 5A, the via hole VIA is surrounded by two turns of the residual patterns RI. In order to verify that the residual patterns formed to what degree provide sufficient effects, samples with variations of residual patterns were formed.

Figure 6A:
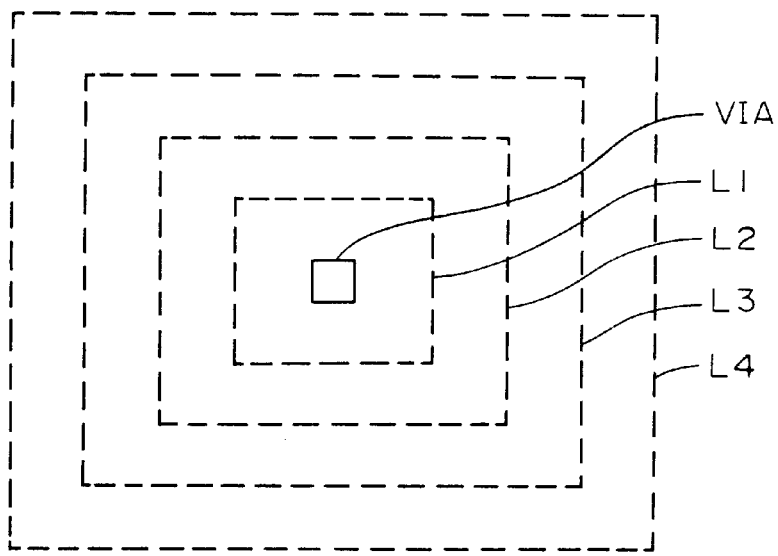
FIGS. 6A and 6B are a schematic plan view and a graph illustrating a wiring structure according to an embodiment of the invention.

FIG. 6A is a schematic plan view showing the structure of one of the samples formed. A via hole VIA has a cross section of a square having a side length of 0.3 μm and has a height of 0.7 μm. A width of an upper wiring connected to the conductor in the via hole VIA is 10 μm. Surrounding the via hole VIA, residual patterns RI having a square cross section of 0.5 μm in side length are disposed in a square lattice shape at a pitch of 1.2 μm along loops L1, L2, L3 and L4.

Adjacent residual patterns RI defined a narrow phantom wiring having a width of 0.7 μm therebetween. The residual patterns RI were disposed along the virtual loops L1, L2, L3 and L4, surrounding the via hole VIA. Samples were formed, including a sample without residual patterns RI, a sample with four residual patterns RI along the loop L1, a sample with residual patterns RI along the two loops L1 and L2, and a sample with residual patterns along the four loops L1, L2, L3 and L4. The defective factors of these samples were measured.

Figure 6B:
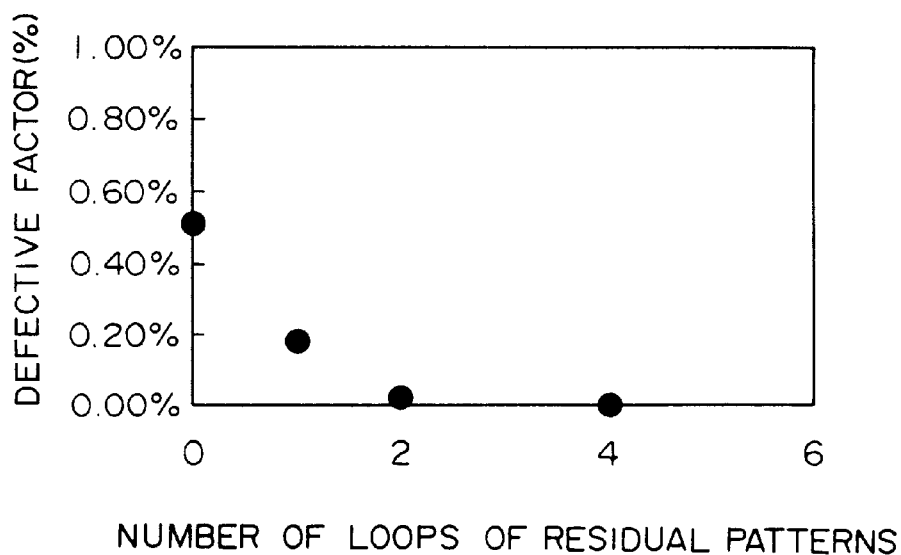

FIG. 6B is a graph showing the defective factors relative to the number of loops along which the residual patterns of the insulating film were disposed. The abscissa represents the number of loops of the residual patterns, and the ordinate represents the defective factor in %.

If the residual patterns are not formed, the defective factor is about 0.5% which is the same as that described earlier. With the residual patterns of one loop, the defective factor lowers to about 0.2% or lower. With the residual patterns of two loops, the defective factor is approximately near to 0%. With the residual patterns of four loops, the defective factor is almost 0%.

From these results, it is desired to form the residual patterns at least along one loop, or preferably two loops or more, in order to lower the defective factor. Although a lower defective factor is ensured by increasing the number of residual pattern loops, if a number of residual patterns are formed, the resistance of a wide wiring increases. It is not therefore preferable to form the residual patterns too many from the viewpoint of the resistance of a wiring. It is not desired generally to form residual patterns of five or more loops.

In the example shown in FIG. 5A, the residual pattern of 0.5 $\mu$m square is formed in an area of 1.2 $\mu$m square. The occupied area factor of the residual pattern is about 17%. Similar effects can be expected even if the pitch between adjacent residual patterns is increased. However, it is preferable that the occupied area factor is about 10% or higher in the region where residual patterns are formed.

It is desired to form residual patterns in an area containing a rectangle area having a side length of 2 $\mu$m or longer, or preferably 5 $\mu$m or longer.

Figure 7A:
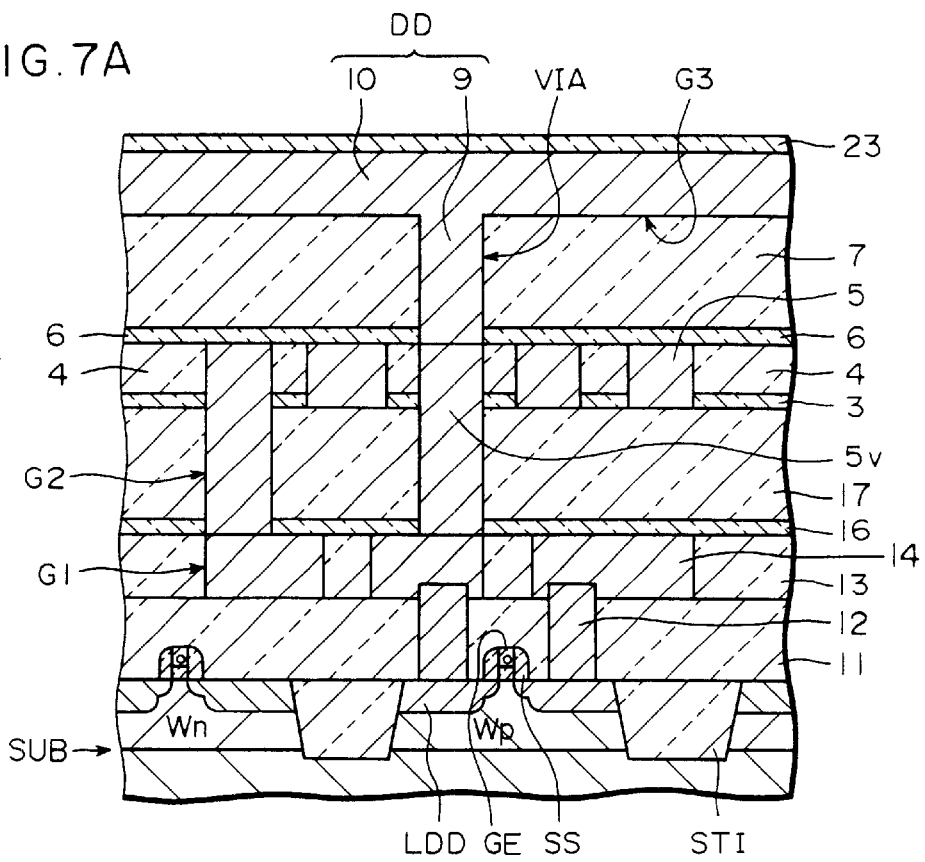
FIGS. 7A and 7B are cross sectional views of a semiconductor device having a wiring structure according to an embodiment of the invention.
Figure 7B:
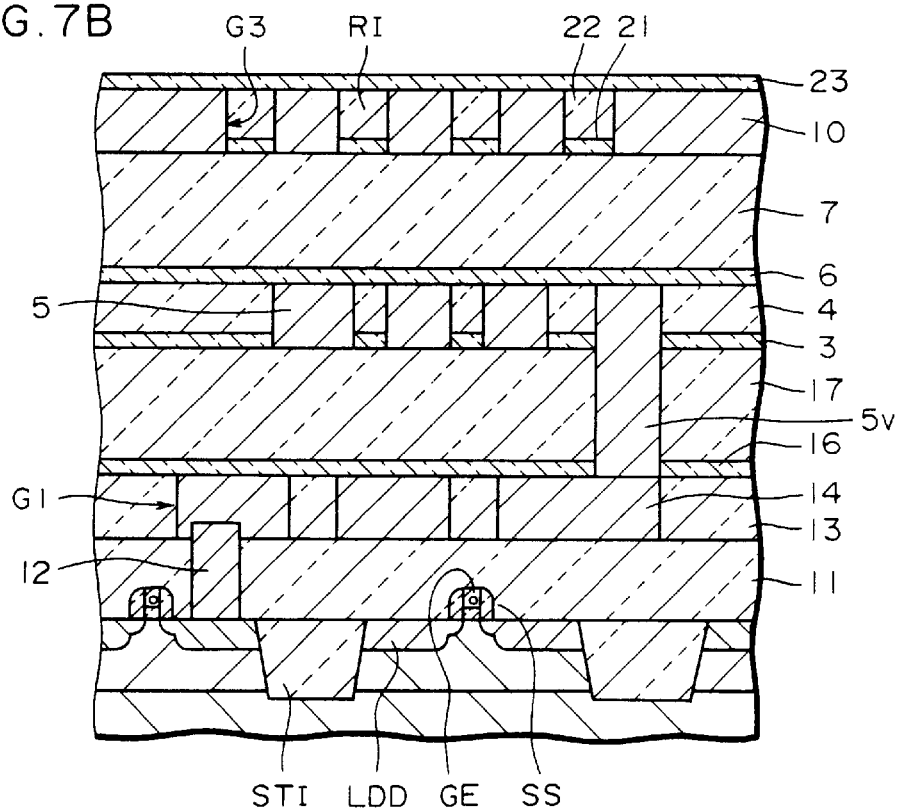

FIGS. 7A and 7B show the structure of multi-layer wirings formed by the dual damascene wiring having the plan layout shown in FIG. 5A, according to an embodiment of the invention. FIG. 7A is a cross sectional view taken along line VIIA—VIIA shown in FIG. 5A, and FIG. 7B is a cross sectional view taken along line VIIB—VIIB shown in FIG. 5A.

In a p-type region of a semiconductor substrate SUB, an n-type well Wn and a p-type well Wp are formed. An element isolation trench is formed from the substrate surface down into the substrate. This trench is buried with insulating material such as $SiO_2$, and the substrate surface is thereafter planarized by CMP or the like to thereby form an element separation region STI of shallow trench isolation (STI).

An insulated gate structure GE is formed above the well region, the insulated gate structure being made of a gate oxide film and a polysilicon gate electrode. Side spacers SS of insulating material such as $SiO_2$ are formed on the side walls of the insulated gate structure GE. By using the insulated gate structure and side spacers, ions are implanted at two stages to form source and drain regions LDD having the LDD structure. A p-channel MOS transistor is therefore formed in an n-type well Wn and an n-channel MOS transistor is formed in the p-type well.

A first interlayer insulating film 11 made of insulating material such as $SiO_2$ is formed on the surface of the semiconductor substrate. Contact holes are formed through the first interlayer insulating film 11, reaching the source/drain regions. A tungsten (W) plug 12 is buried in the contact hole. If a blanket W layer is formed, this W layer formed on the upper surface of the first interlayer insulating film 11 is removed by etch-back, CMP or the like.

A second interlayer insulating film 13 made of insulating material such as $SiO_2$ is formed on the surface of the first interlayer insulating film. A first metal wiring layer trench G1 is formed in the second interlayer insulating film, and a first damascene wiring 14 of Cu or the like is formed in this trench G1. After the first damascene wiring 14 is formed, a third interlayer insulating film is formed over the substrate surface. The third interlayer insulating film may be a lamination of an SiN layer 16 and an $SiO_2$ layer 17.

A fourth interlayer insulating film of a lamination of an SiN layer 3 and an $SiO_2$ layer 4 is formed on the third interlayer insulating film. Via conductors 5v are formed in via holes formed through selective etching of the fourth and third interlayer insulating films, the via conductors being connected to the first metal wiring 14. A second metal wiring 5 is formed in a wiring layer trench formed through selective etching of the fourth interlayer insulating film. The via conductor filling the via hole is formed at the same time when the second metal wiring is formed. The second metal wiring 5 is a narrow wiring having a width of 1 $\mu$m or narrower near the via hole.

As shown in FIG. 7B, fifth and sixth interlayer insulating films are formed on the fourth interlayer insulating films. The fifth interlayer insulating film is a lamination of an SiN layer 6 and an $SiO_2$ layer 7, and the sixth interlayer insulating film is a lamination of an SiN layer 21 and an $SiO_2$ layer 22. A wide wiring layer trench G3 such as shown in FIG. 5A is formed in the sixth interlayer insulating film.

As shown in FIG. 7A, a via hole VIA is formed from the bottom of the wide wiring layer trench G3 to the surface of the via conductor 5v. In an area near the via hole VIA, residual patterns RI of the fifth interlayer insulating film are formed as shown in FIG. 7B, for the wide wiring trench G3. The residual patterns RI distribute as shown in FIG. 5A.

After a barrier metal layer of TaN or the like is formed on the surfaces of the wide wiring layer trench G3 and via hole VIA, a Cu plating layer is formed to fill the trench and via hole VIA to thus form a third metal wiring layer 10 and a via conductor 9. An unnecessary wiring on the upper surface of the sixth interlayer insulating film is removed by CMP. The surface of the third metal wiring 10 is flush with the surface of the $SiO_2$ layer 22. An SiN layer 23 is formed on the surface of the $SiO_2$ layer 22, covering the third metal wiring 10.

FIGS. 8A and 8B, FIGS. 9A and 9B and FIGS. 10A and 10B are schematic cross sectional views illustrating manufacture processes for the wiring structure shown in FIGS. 7A and 7B. A semiconductor substrate SUB has an element separation region STI formed by a well known method and an insulated gate electrode structure GE formed on each well. An $SiO_2$ layer 11 is formed by CVD, covering the insulated gate electrode structure GE.

Contact holes are formed from the surface of the $SiO_2$ layer 11 to the surfaces of the source/drain regions LDD of each MOS transistor. A tungsten plug 12 is buried in the contact hole. After the tungsten plug 12 is formed, another $SiO_2$ layer 13 is formed covering the $SiO_2$ layer 11.

A resist pattern is formed on the $SiO_2$ layer 13 and a first metal wiring layer trench G1 is formed through etching. After the first metal wiring layer trench G1 is formed, a barrier layer of TaN or the like is formed by sputtering and a Cu layer is formed by electrolytic plating. The Cu layer and barrier metal layer on the surface of the $SiO_2$ layer 13 are polished and removed by CMP or the like. In this manner, a first metal wiring 14 is formed. An SiN layer 16 is formed on the surface of the $SiO_2$ layer 13 by CVD or the like, covering the first metal wiring 14.

Figure 8A:
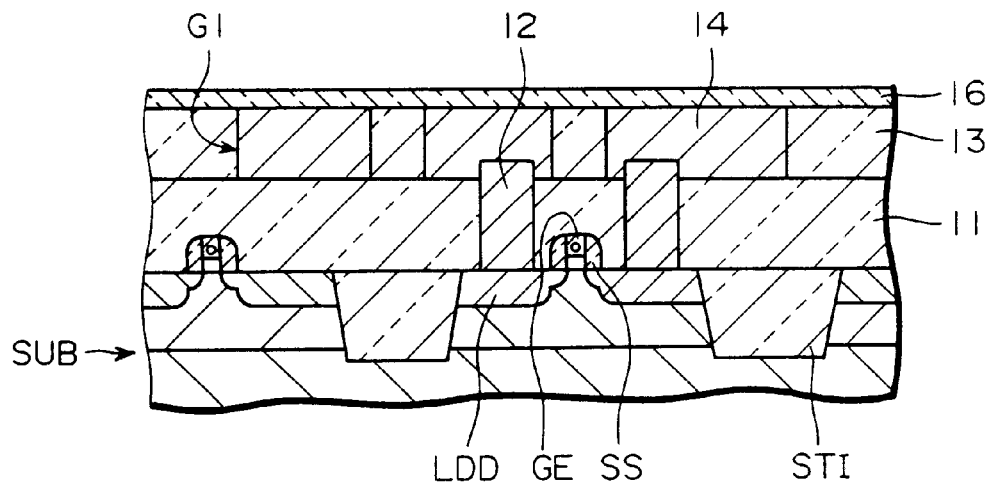
FIGS. 8A, 8B, 9A, 9B, 10A and 10B are cross sectional views illustrating the processes of manufacturing the semiconductor device shown in FIGS. 7A and 7B.
Figure 8B:
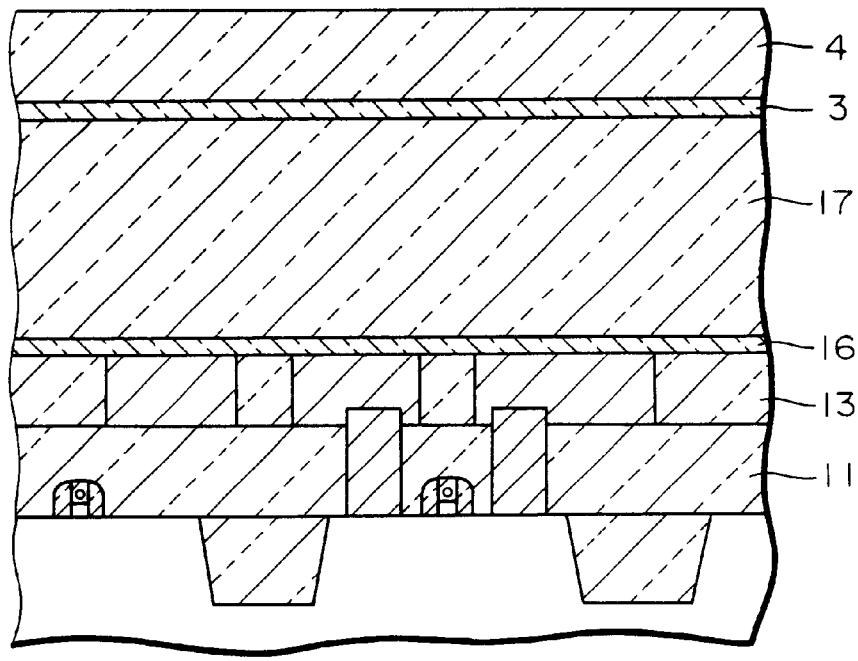

As shown in FIG. 8B, an $SiO_2$ layer 17 is formed on the SiN layer 16 by CVD, and an SiN layer 3 and an $SiO_2$ layer 4 are formed in this order on the $SiO_2$ layer 17.

Figure 9A:
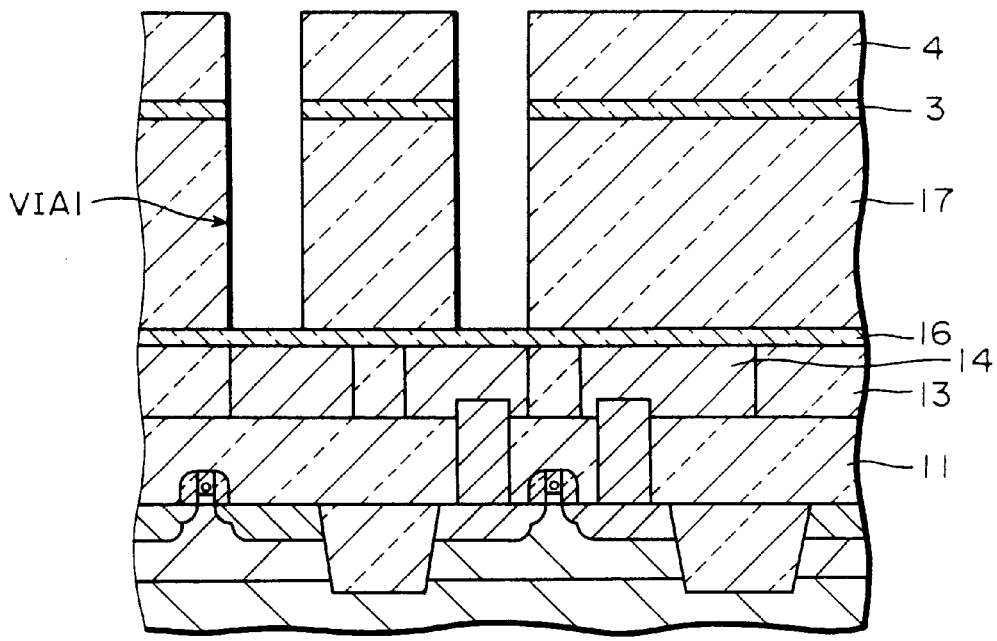

As shown in FIG. 9A, for example, a resist pattern is formed on the surface of the SiO$_2$ layer 4 and a via hole is formed from the surface of the SiO$_2$ layer to the surface of the SiN layer 16. The resist pattern is thereafter removed.

Figure 9B:
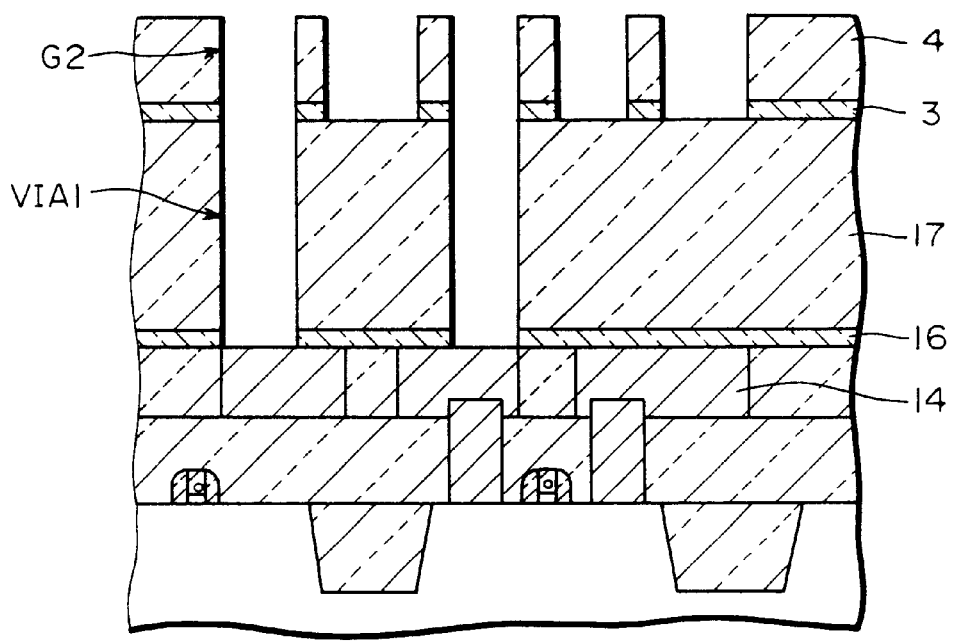

As shown in FIG. 9B, after the via hole is buried with resist or the like when necessary, another resist pattern is formed on the surface of the SiO$_2$ layer 4. The SiO$_2$ layer 4 is etched to form a wiring layer trench reaching the surface of the SiN layer 3. Thereafter, the SiN layers 3 and 16 exposed on the bottoms of the trench and via hole are etched to form a wiring layer trench G2 and via hole VIA1 shown in FIG. 9B. The surface of the first metal wiring 14 is exposed on the bottom of the via hole VIA1.

Figure 10A:
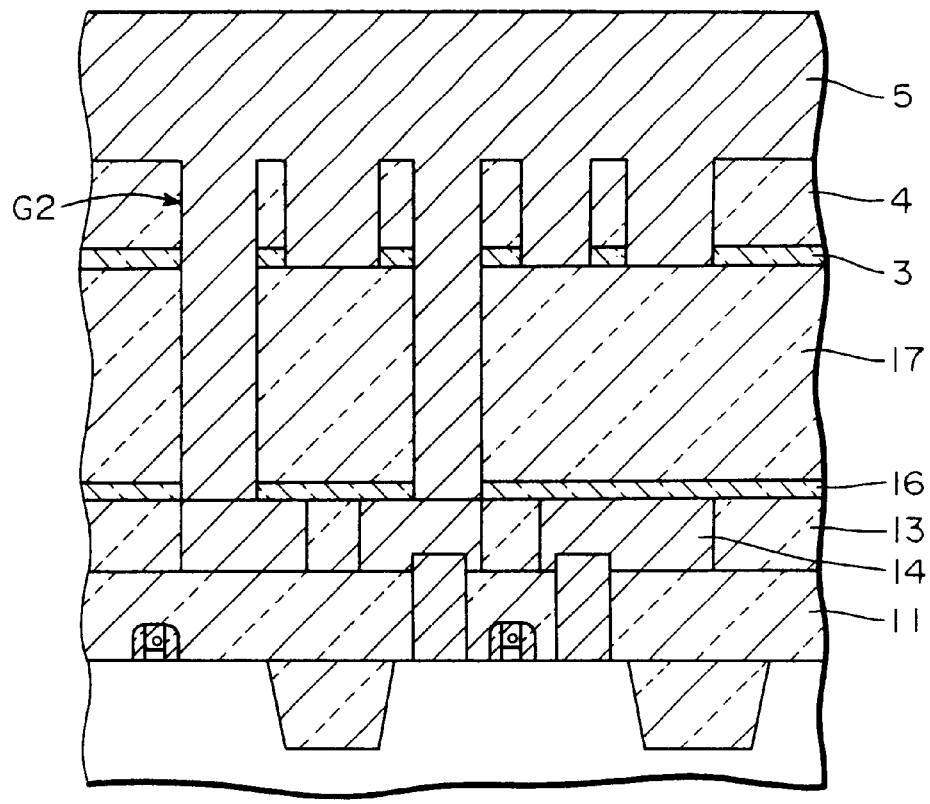

As shown in FIG. 10A, a barrier metal layer of TaN or the like is formed on the surfaces of the wiring layer trench G2 and via hole VIA1 by sputtering, and thereafter a Cu layer 5 is formed by electrolytic plating.

Figure 10B:
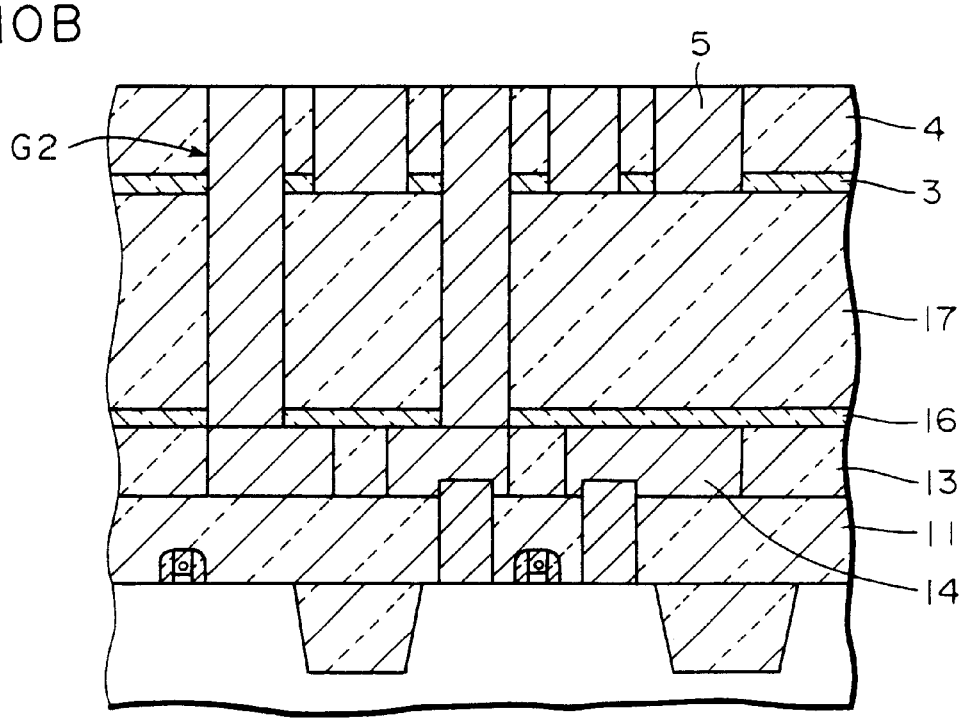

As shown in FIG. 10B, the Cu layer 5 is polished by CMP to expose the surface of the SiO$_2$ layer 4. The Cu layer 5 fills the wiring layer trench G2 and via hole VIA1 to thereby form a second metal wiring 5 and a via conductor 5v.

Thereafter, as shown in FIGS. 7A and 7B, an SiN layer 6, an SiO$_2$ layer an SiN layer 21 and an SiO$_2$ layer 22 are laminated on the SiO$_2$ layer 4, covering the second metal wiring 5. Thereafter, processes similar to those illustrated in FIGS. 9A and 9B and FIGS. 10A and 10B are executed, to form a third wide metal wiring 10 and a via conductor 9 connected to the line 10 such as shown in FIGS. 7A and 7B. An SiN layer 23 is formed on the SiO$_2$ layer 22, covering the third metal wiring 10 to realize the structure shown in FIGS. 7A and 7B.

In the embodiments described above, residual patterns of the insulating film having a shape like a pillar are left in the peripheral area of the via hole to control the diameter of crystal grains in the wide wiring on the conductor of the via hole. The width of a wiring itself connected to the conductor in a via hole may be changed to control the crystal grain diameter.

Figure 11A:
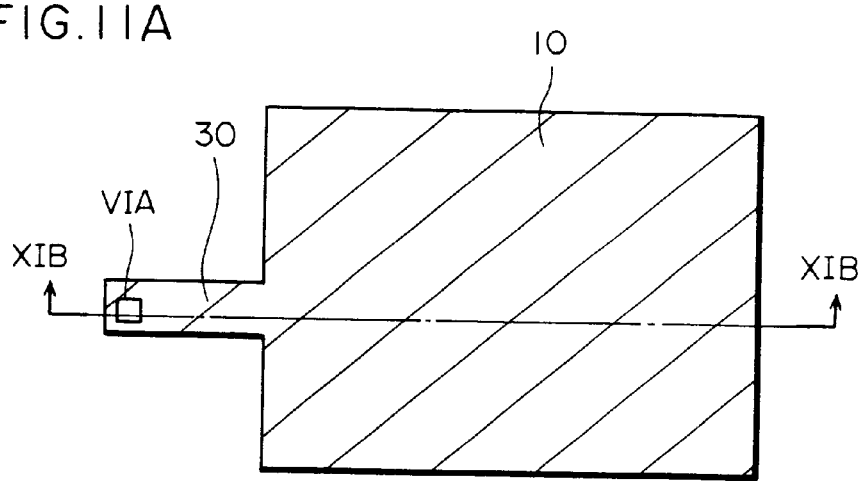
FIGS. 11A and 11B are a plan view and a cross sectional view of a semiconductor device having a wiring structure according to an embodiment of the invention.
Figure 11B:
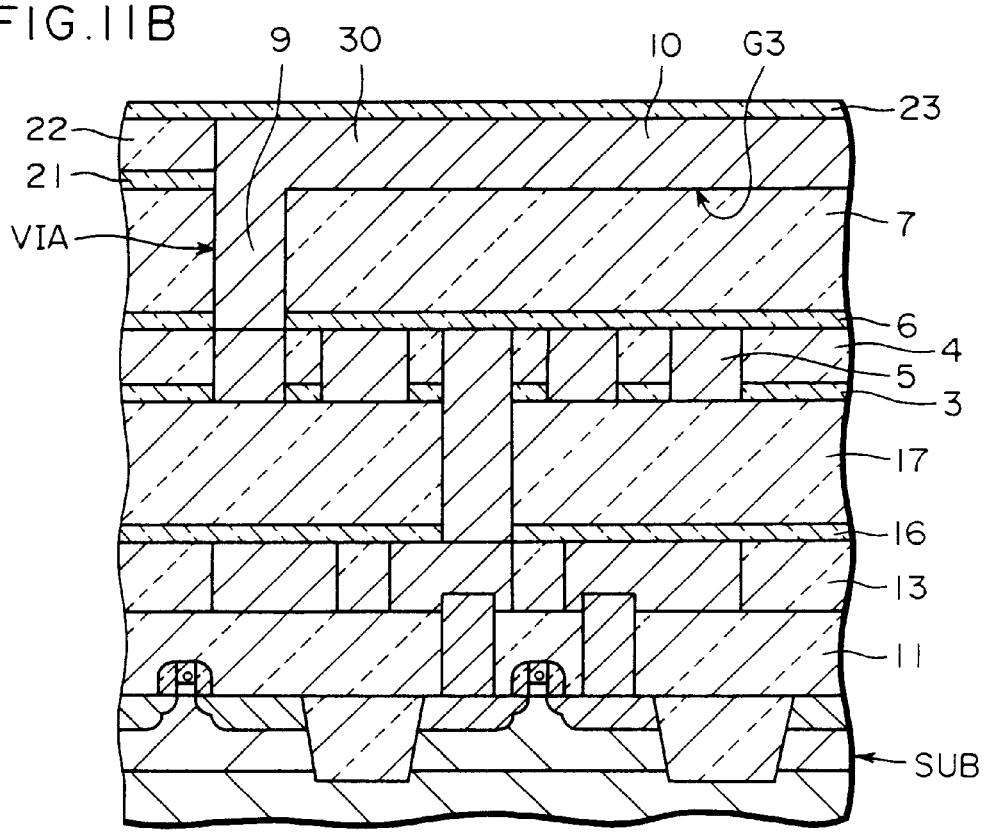

FIGS. 11A and 11B show a wiring structure according to another embodiment of the invention. FIG. 11A is a plan view showing the wiring structure, and FIG. 11B is a cross sectional view thereof. The structure from a substrate SUB to a second metal wiring 5 is similar to that shown in FIG. 7A. An interlayer insulating film is formed covering the second metal wiring 5, by laminating an SiN layer 6, an SiO$_2$ layer 7, an SiN layer 21 and an SiO$_2$ layer 22.

A resist pattern is formed on the surface of the SiO$_2$ layer 22. The SiO$_2$ layer 22 is etched to form a wiring layer trench G3. Next, a resist pattern having an opening in a shape of a via hole is formed, and the SiN layer 21 and SiO$_2$ layer 7 are etched to form the via hole. The SiN layer left on the bottom surfaces of the wiring layer trench and via hole is etched to complete the wiring layer trench G3 and via hole VIA.

A barrier metal layer is formed on the surfaces of the wiring layer trench and via hole by sputtering, and a Cu layer is formed by electrolytic plating. An unnecessary wiring layer is polished and removed by CMP to form a wide wiring 10, a narrow wiring 30 and a via conductor 9. As shown in FIG. 11A, the via conductor 9 is connected via the narrow wiring 30 to the wide wiring 10. The narrow wiring 30 has a width and length meeting the requirements for making the diameter of Cu crystal grains sufficiently small.

The present inventors have studied a change in the defective factor with a length of the narrow wiring 30 having a width of 0.3 $\mu$m when the via hole has a square cross section having a side length of 0.3 $\mu$m.

Figure 12:
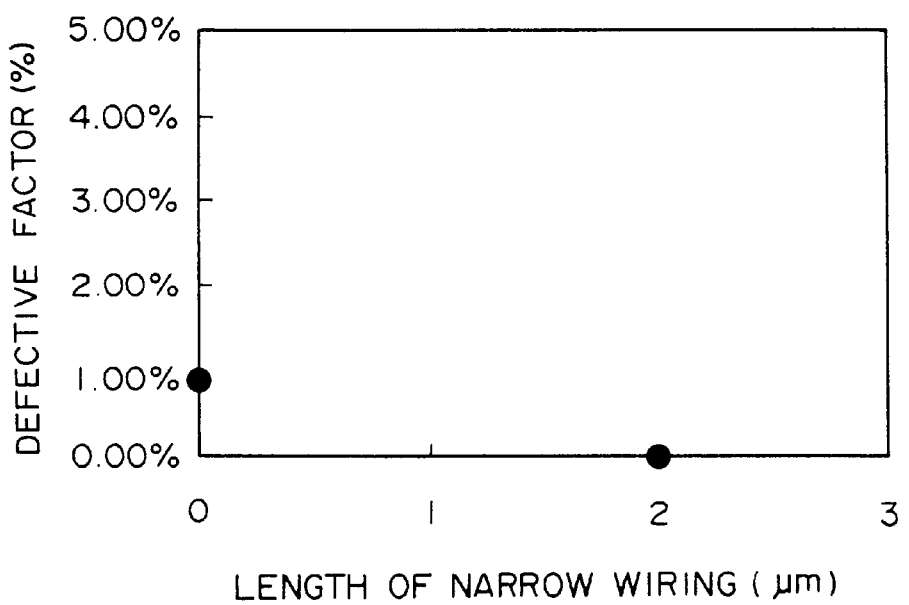
FIG. 12 is a graph showing the measurement results of defective factors of semiconductor devices shown in FIGS. 11A and 11B.

FIG. 12 is a graph showing a change in the defective factor relative to the length of a narrow wiring. A sample without the narrow wiring and a sample having the narrow wiring length of 2 $\mu$m was checked. The sample without the narrow wiring has the structure similar to that shown in FIGS. 2A and 2B, with a different width of 0.3 $\mu$m of the lower wiring.

The sample without the narrow wiring showed the defective factor of about 1%. The sample with the narrow wiring of about 2 $\mu$m in length showed the defective factor of about 0%. It can therefore be expected that stress migration can be suppressed sufficiently if the length of the narrow wiring is set sufficiently long. Although the samples having the width of 0.3 $\mu$m of the narrow wiring were checked, similar effects may be expected if the width of the narrow wiring is about 2 $\mu$m or narrower. The width of the narrow wiring is more preferably about 1 $\mu$m or narrower.

As shown in FIG. 2D, if the wiring width is larger than 2 $\mu$m, the problem of stress migration arises. However, if the width is relatively narrow, e.g., about 3 $\mu$m wide, it may become difficult to dispose a number of insulating pillars in the width direction.

Figure 13A:
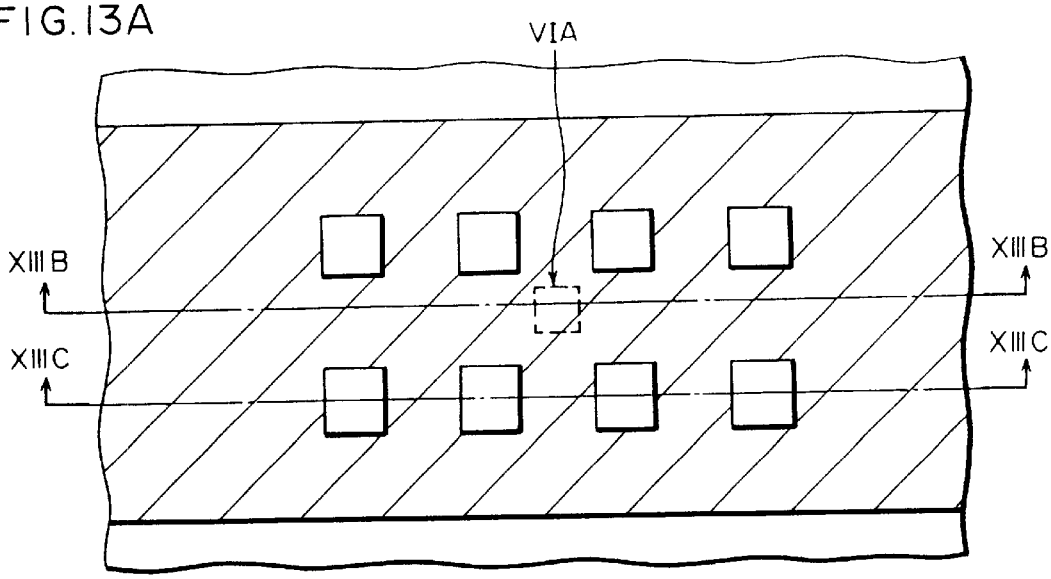
FIGS. 13A, 13B and 13C are a plan view and cross sectional views of a wiring structure according to an embodiment of the invention.
Figure 13B:
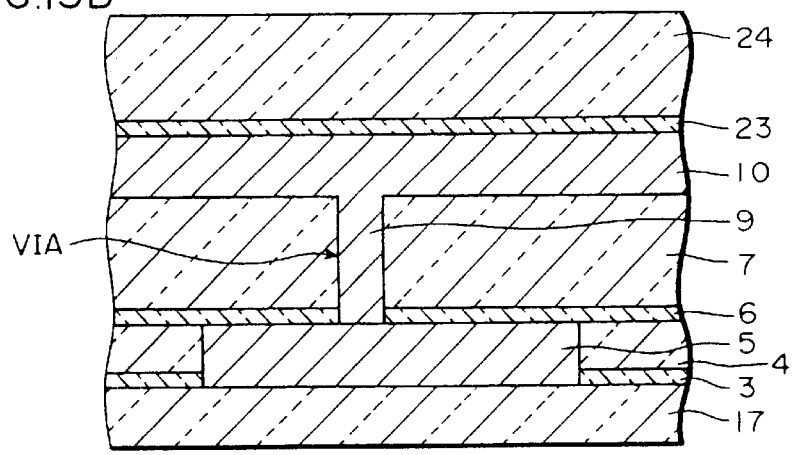
Figure 13C:
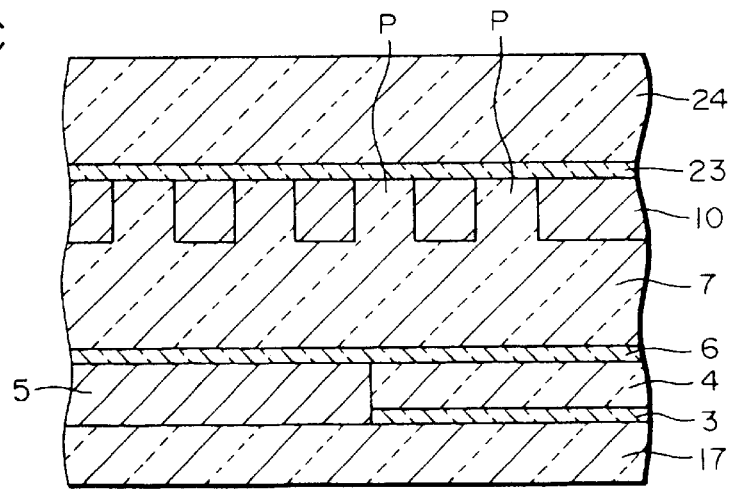

FIGS. 13A, 13B and 13C show a layout of insulating pillars disposed around a relatively narrow wide wiring. FIGS. 13B and 13C are cross sectional views taken along lines XIIIB—XIIIB and XIIIC—XIIIC shown in FIG. 13A. In FIG. 13B, a lower wiring 5 is connected via a via conductor 9 to an upper wiring 10.

In the cross section shown in FIG. 13C, the lower wiring extends from the left to the right under the via hole with a larger width than the via hole, and the upper wiring 10 is intermittently cut by insulating pillars P. A lamination of an SiN layer 23 and an SiO$_2$ layer 24 is formed on the upper wiring 10. Another upper wiring may be formed in this lamination.

Since the width of the wiring is relatively narrow, insulating pillars made of residual patterns of the insulating film cannot be disposed completely along the second loop. The insulating pillars disposed only along the first loop may insufficiently control the diameter of crystal grains in the wiring near the via hole.

In such a case, as shown in FIG. 13A, insulating pillars are disposed duplicately along the wiring length direction. Although insulating pillars are not disposed duplicately along the wiring width direction, the side wall of the insulating film defining the wiring layer trench provides a function similar to the pillar so that sufficient crystal grain diameter suppression effects can be expected. Namely, if a path from the upper area of the via hole to the outer side of the wide wiring crosses the narrow wiring n times, it can be considered that there are insulating pillars multiplied by n.

Figure 14:
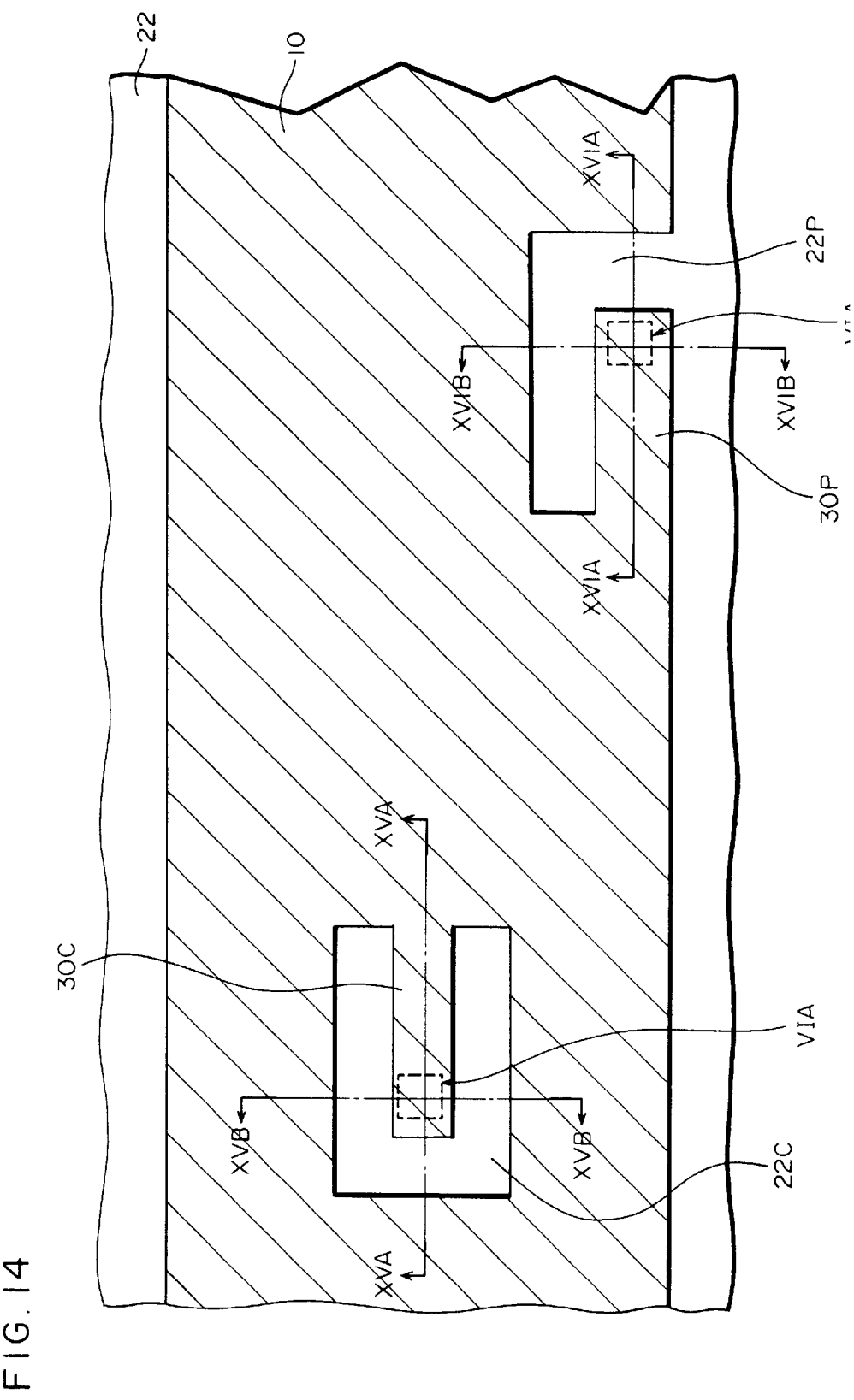
FIG. 14 is a plan view of a wiring structure according to an embodiment of the invention.
Figure 15A:
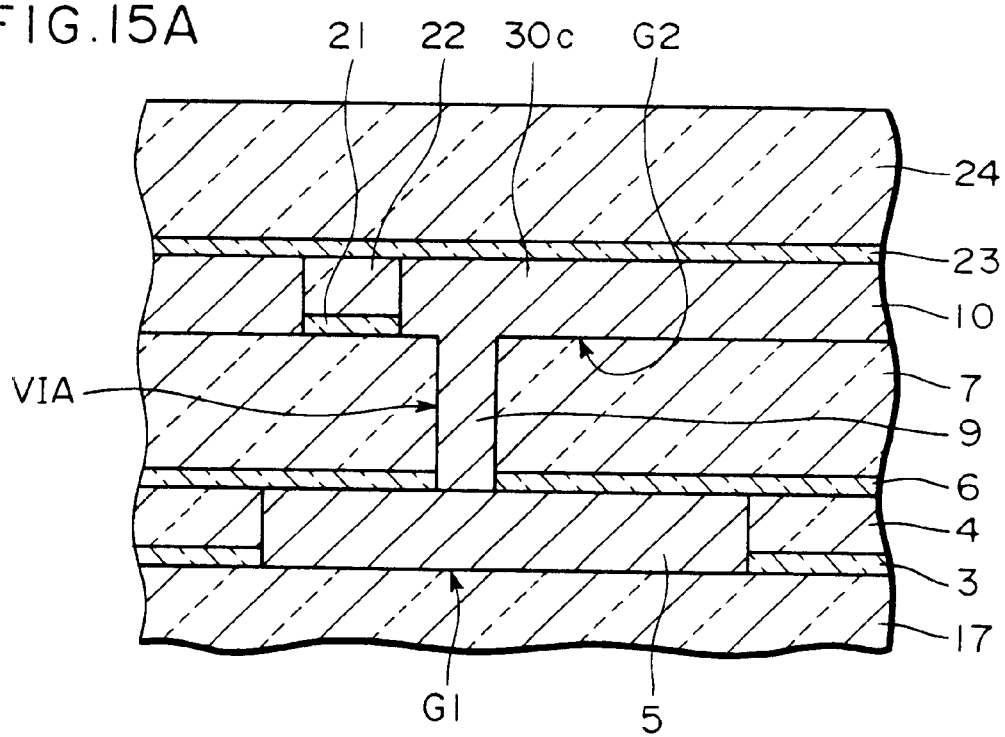
FIGS. 15A, 15B, 16A and 16B are cross sectional view of the wiring structure shown in FIG. 14.
Figure 15B:
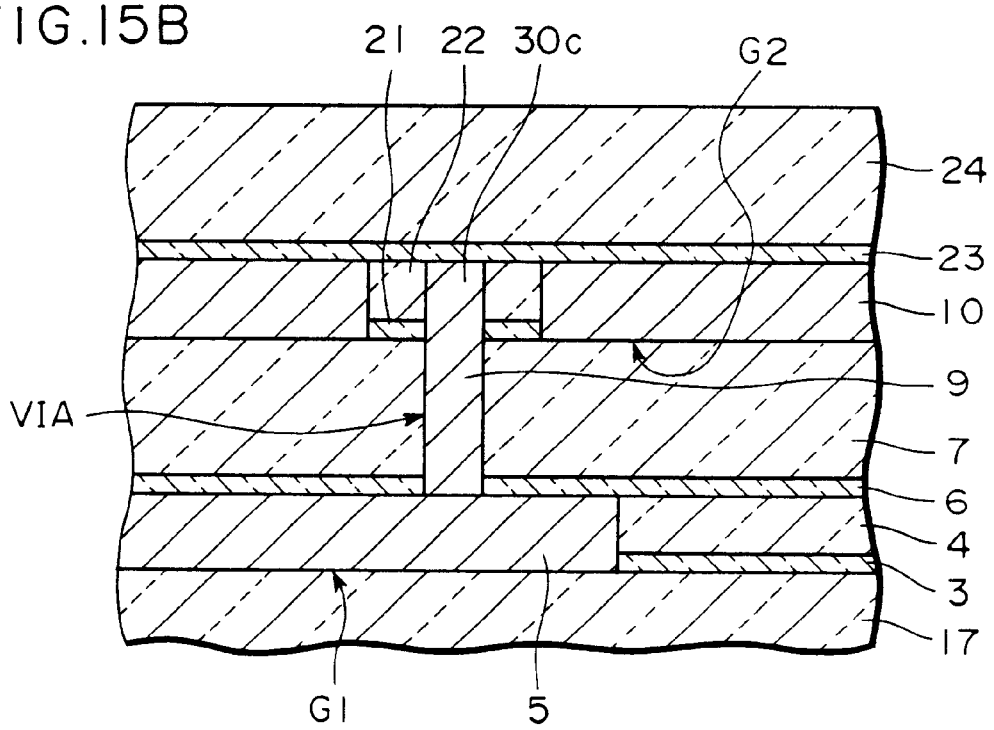
Figure 16A:
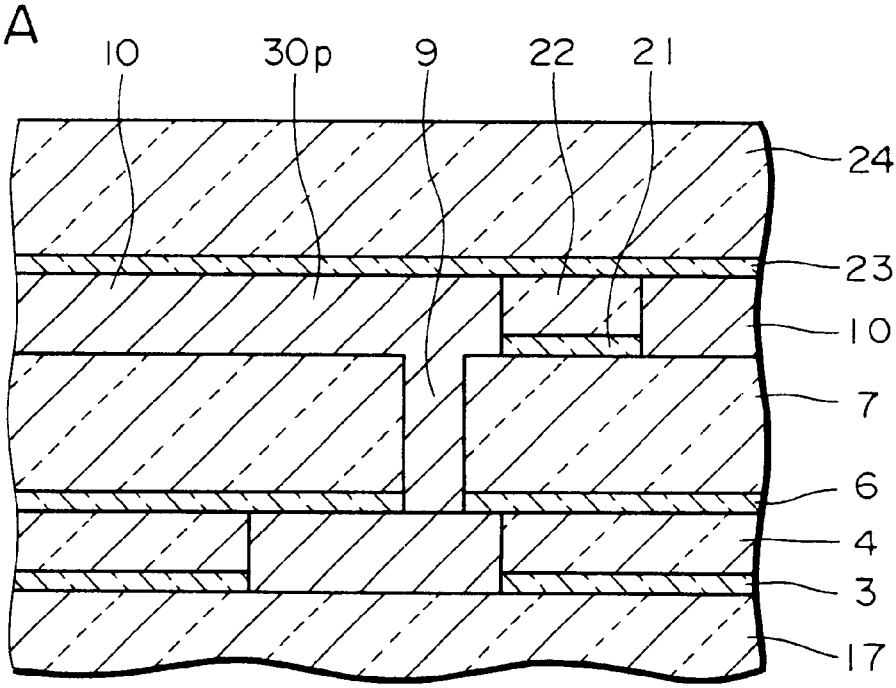
Figure 16B:
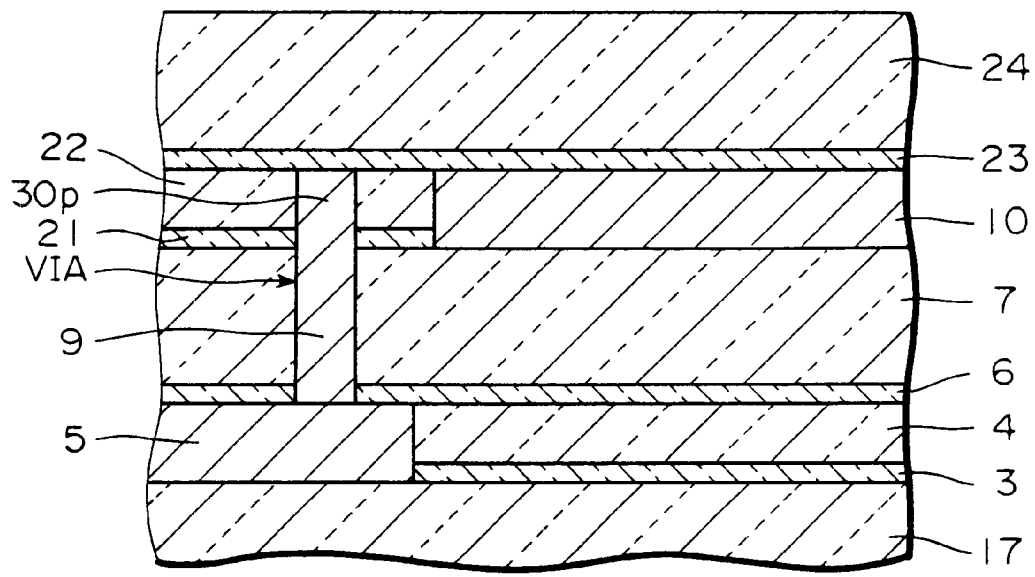

FIG. 14, FIGS. 15A and 15B and FIGS. 16A and 16B show a wiring structure according to another embodiment of the invention. FIG. 14 is a plan view showing the wiring structure, and FIGS. 15A and 15B are cross sectional views taken along lines XVA—XVA and XVB—XVB shown in FIG. 14. FIGS. 16A and 16B are cross sectional views taken along lines XVIA—XVIA and XVIB—XVIB shown in FIG. 14.

As shown in FIG. 14, an insulating pattern is formed in a wide wiring 10, and in an area defined by the insulating pattern, a narrow wiring is formed which connects a conductor in a via hole VIA and the wide wiring 10. The narrow wiring 30c formed in the central area of the wide wiring 10 has three sides surrounded by the U-character shaped insulating pattern 22c. For example, a width of the narrow wiring 30c is about 0.3 μm, and a distance from the end of the via hole to the end of the wide wiring is about 2 μm. The via hole VIA has, for example, a square cross section having a side length of 0.3 μm.

A narrow wiring 30p connected to a conductor in a via hole formed in an area near the side of a wide wiring 10 has upper and right sides defined by an insulating pattern 22p having a crank shape. For example, a width of the narrow wiring is about 0.3 μm and a distance from the end of the via hole VIA to the end of the wide wiring is about 2 μm. Connection of a conductor in the via hole VIA and the wide wiring by the narrow wiring is similar to the embodiment shown in FIGS. 11A and 11B.

FIGS. 15A and 15B show the wiring structure near the via hole formed in the central area of the wide wiring 10. A lamination of an SiN layer 3 and an SiO$_2$ layer 4 is formed on a lower SiO$_2$ layer 17. In this lamination, a lower wiring layer trench G1 is formed. The lower wiring layer trench G1 is buried with a lower wiring 5.

A lamination of an SiN layer 6, an SiO$_2$ layer 7, an SiN layer 21 and an SiO2 layer 22 is formed over the lower wiring 5. The via hole VIA is formed from the bottom of an upper wiring layer trench G2 through the SiO$_2$ layer 7 and SiN layer 6. A via conductor 9 is buried in the via hole ViA, and upper wirings 30c and 10 are buried in the upper wiring layer trench G2.

The via conductor 9 buried in the via hole VIA is not directly connected to the upper wide wiring 10, but first connected to the narrow wiring 30c which is then connected to the upper wide wiring 10.

As shown in FIG. 15B, the narrow wiring 30c has the same width as the via conductor 9. The narrow wiring 30c is not necessarily required to have the same width as the via conductor, but it is sufficient if the width is 2 μm or narrower. The length of the narrow wiring 30c is set so as to make the Cu crystal grain diameter as small as possible, for example, 2 μm or longer.

FIGS. 16A and 16B show the structure of the narrow wiring formed near the side of the wide wiring 30p. As shown in FIG. 16A, a via conductor 9 is first connected to the narrow wiring 30p which is then connected to the wide wiring 10. The right side of the narrow wiring 30p is defined by a lamination of an SiN layer 21 and an SiO$_2$ layer 22.

As shown in FIG. 16B, the narrow wiring 30p has the same width as the via conductor 9. The narrow wiring 30p is not necessarily required to have the same width as the via conductor, but it is sufficient if the width is 2 μm or narrower. The length of the narrow wiring 30p is set so as to make the Cu crystal grain diameter as small as possible, for example, 2 μm or longer.

In the embodiments shown in FIGS. 11A and 14, the via conductor is connected via one narrow wiring to the wide wiring. The via conductor may be connected via a plurality of narrow wirings to the wide wiring.

FIGS. 17A, 17B and 17C show a wiring structure according to another embodiment of the invention. As shown in FIG. 17A, a via hole VIA is disposed in the central area of a wide wiring 10. Insulating stripes S1 and S2 are formed sandwiching the via hole VIA, and define two narrow wirings 30x and 30y.

Each of the narrow wirings 30x and 30y extending from the end of the via hole VIA to the end of the wide wiring has a width of about 0.3 μm and a length of about 2 μm.

FIG. 17B is a cross sectional view taken along line XVIIB—XVIIB shown in FIG. 17A. A lower wiring 5 is connected via a via conductor 9 to the narrow wirings 30x and 30y.

FIG. 17C is a cross sectional view taken along line XVIIC—XVIIC shown in FIG. 17A. The narrow wiring 30 has the width approximately equal to that of the via conductor 9. The insulating stripes S1 and S2 are formed on both sides of the narrow wiring 30 to define its width. Other points are similar to the embodiment described above.

In this embodiment, right and left wide wirings 10 are connected also by the narrow wiring 30 which effectively functions as a portion of a wiring connecting the right and left wide wirings 10. The via conductor 9 is also connected to the right and left wide wirings 10 in two directions so that a wiring having a lower resistance can be formed. Although the via conductor is connected via the narrow wirings to the right and left wide wirings, three or more narrow wirings may also be used.

Figure 18B:
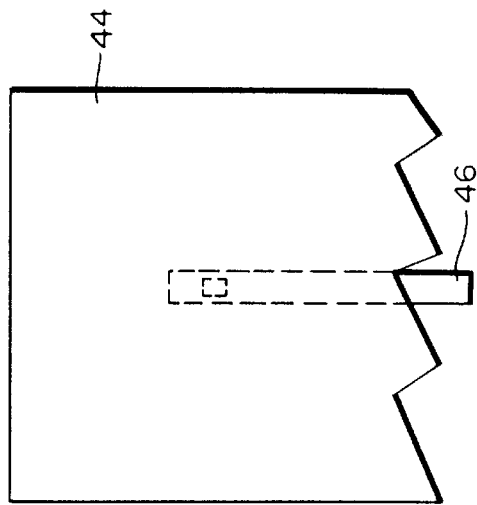
FIGS. 18A, 18B and 18C are plan views and a cross sectional view of a semiconductor device according to an embodiment of the invention.
Figure 18C:
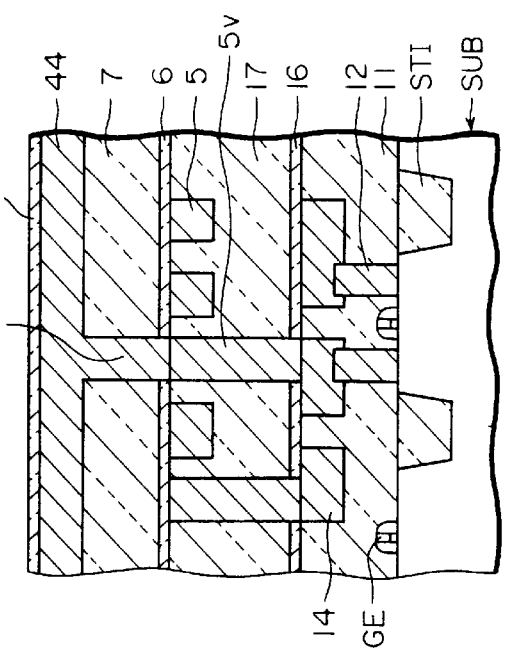
Figure 18A:
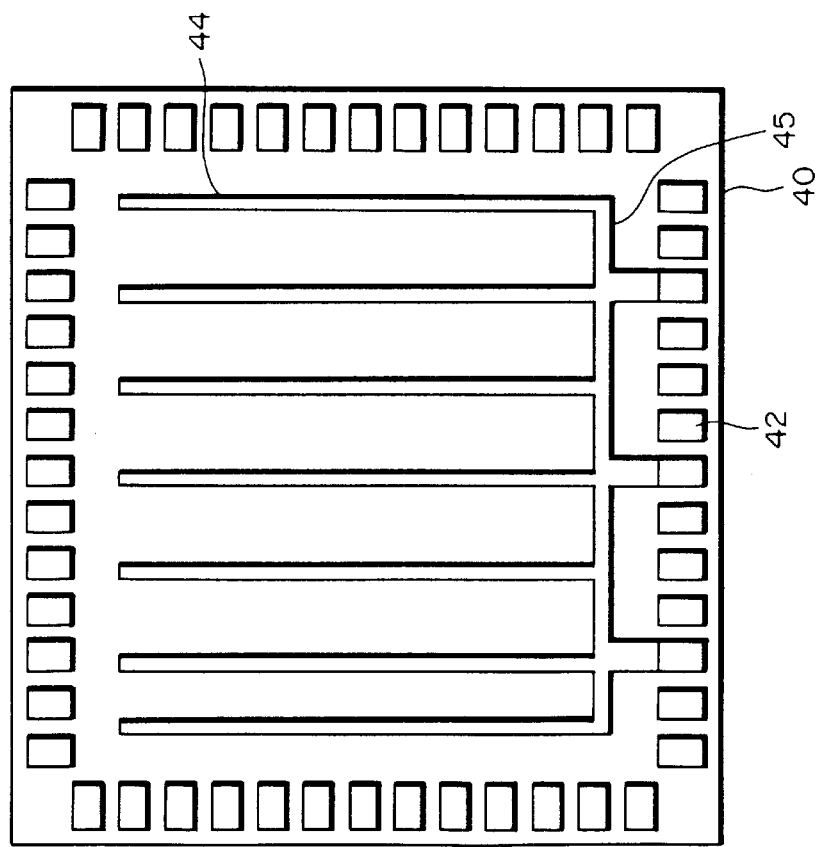

FIGS. 18A, 18B and 18C are schematic diagrams showing the structure of a semiconductor integrated circuit. FIG. 18A is a schematic plan view showing the layout of a semiconductor chip. A number of pads 42 are formed in the peripheral area of the semiconductor chip 40. Some of these pads are used as power supply pads. Power supply wirings 44 are connected to the power supply pads. A plurality of power supply wirings 44 are juxtaposed in a vertical direction in FIG. 18A and converged to one power supply line 45 on the side of the power supply pads. This power supply line 45 is connected to a plurality of power supply pads. Each power supply wiring 44 is a wide wiring wider than other wirings.

FIG. 18B is a schematic diagram showing the structure of the power wiring or wide wiring. The power supply wiring 44 is connected via a conductor in a via hole to a lower wiring 46. The lower wiring 46 is, for example, a signal wiring, and has a width considerably narrower than that of the wide wiring 44.

FIG. 18C is a cross sectional view showing a connection between a lower wiring and the wide wiring. Element isolation regions STI through shallow trench isolation (STI) are formed in a semiconductor substrate SUB. An insulated gate electrode GE is formed on the semiconductor surface to form a transistor.

A tungsten plug 12 is a contact plug for connecting the source/drain region of the transistor. The contact plug 12 is connected to the lower wiring 14 buried in an insulating layer 11. An interlayer insulating film of an SiN layer 16 and an SiO$_2$ 17 is formed on the lower wiring 14. In this interlayer insulating film, an intermediate wiring 5 and a via conductor 5v are formed.

An interlayer insulating film of an SiN layer 6 and an SiO$_2$ layer 7 is formed covering the intermediate wiring 5. In the interlayer insulating film, the power supply wiring 44 and via conductor 9 are formed. An SiN layer 23 is formed on the power supply wiring 44. The power supply wide wiring 44 is connected via the via conductors 9 and 5v to the lower wiring 14, and via the tungsten plug 12 to the source/drain region of the transistor.

Figure 19:
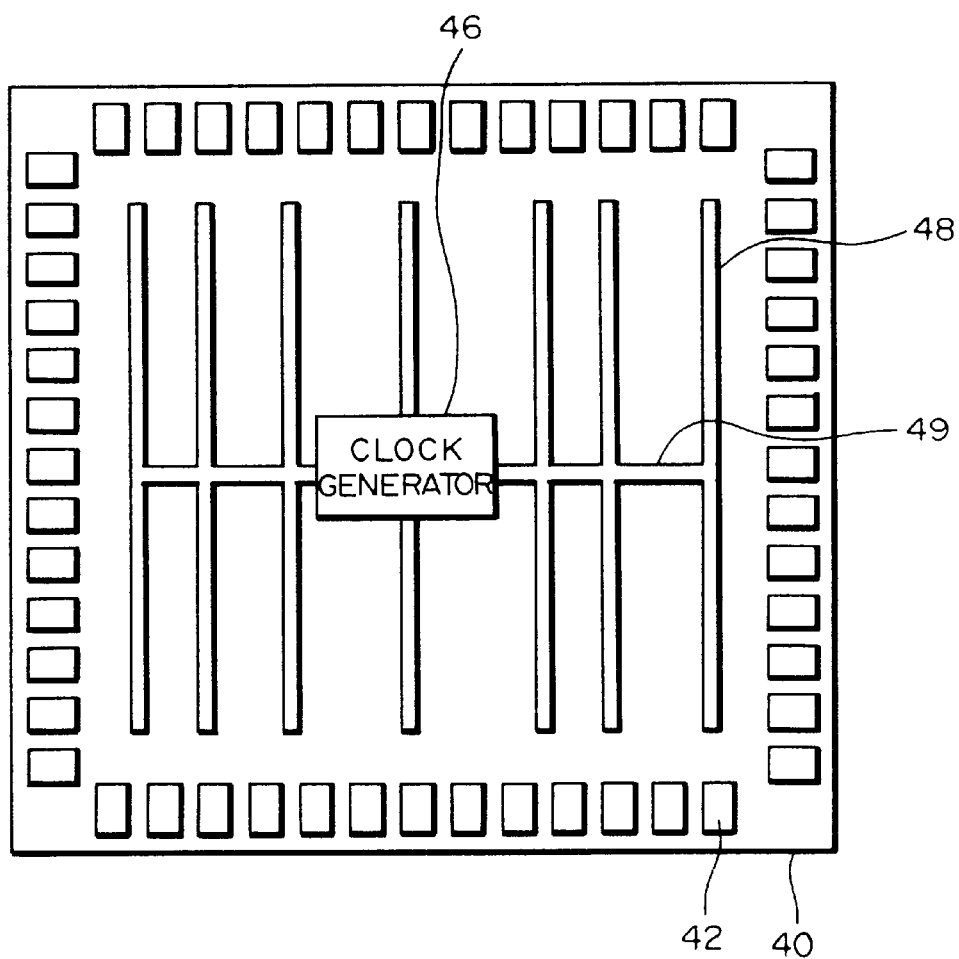
FIG. 19 is a plan view showing the structure of a semiconductor device according to an embodiment of the invention.

FIG. 19 shows an example of the layout of a semiconductor chip of a central processing unit (CPU). A number of pads 42 are disposed in a peripheral area of the semiconductor chip 40. A clock generator circuit 46 is formed in a central area of the chip 40. The clock generator circuit 46 generates a clock signal for controlling timings of various circuits. This clock signal is supplied via clock signal wirings 48 to various circuits of the semiconductor chip 40.

The clock signal is used for synchronizing various circuits so that the clock signal wiring 48 is desired to be made of a low resistance wiring. To this end, the clock signal wiring 48 is made of a wide wiring. A plurality of clock signal wirings 48 are juxtaposed in a vertical direction in FIG. 19, and converged to a relay wiring 49 which is connected to the clock generator circuit 46.

Clock signal wirings are also formed which are supplied with the clock signal directly from the clock generator circuit 46. Each circuit in the chip is connected to the clock signal wiring 48 by forming the wiring structure such as shown in FIG. 18C.

A semiconductor device having power supply wirings such as shown in FIG. 18A and clock wirings such as shown in FIG. 19 may be formed on one chip. It is preferable to form a semiconductor device, particularly a high speed semiconductor device such as a CPU, by using wide wirings as its power supply wirings and signal wirings. In this case, the power supply wirings and signal wirings may be formed by different wiring layers.

In the above embodiments, the narrow wiring is used as the lower wiring, and the barrier metal layer is interposed between the lower wiring and via conductor. In such a case, it can be considered that migration of atoms from the via conductor to the lower wiring is small.

The lower wiring is not limited only to the narrow wiring, and also the barrier layer is not necessarily required to be formed. In such a case, migration from the via conductor to the lower wiring may occur. If the phantom narrow wiring structure is applied to the lower wiring, migration can be suppressed.

Figure 21:
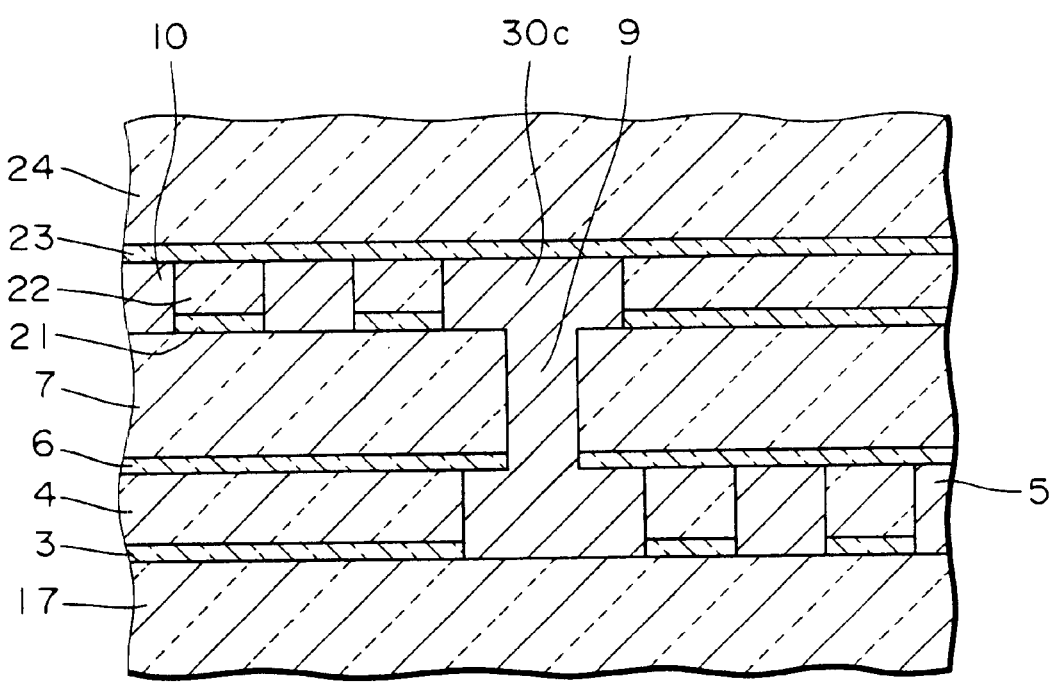
FIG. 21 is a cross sectional view showing a wiring structure according to another embodiment of the invention.

As shown in FIG. 21, an SiN layer 3 and an $SiO_2$ layer 4 formed with a wiring layer trench are formed on a lower insulating film 17. A lower wiring 5 is formed in the wiring layer trench. In this case, residual patterns of the SiN and $SiO_2$ layers 3 and 4 are formed in the lower wiring 5. Namely, the lower wiring has the same structure as the upper wiring described previously. Thereafter, similar to the above-described embodiments, an SiN layer 6, an $SiO_2$ layer 7, an SiN layer 21, and an $SiO_2$ layer 22 are formed and an upper wiring 10 and a via conductor 9 are formed by forming a via hole and a wiring layer trench. Since the wirings above and under the via conductor are made narrow, migration from the via conductor can be suppressed.

The present invention has been described in connection with the preferred embodiments. The invention is not limited only to the above embodiments. For example, in place of a Cu wiring, a wiring made of copper alloy containing Nb, Zr or the like may also be used. The term "pillar" should not be interpreted only as a rod-like shape. Any projecting shape can be called pillar. It will be apparent to those skilled in the art that various modifications, improvements, combinations, and the like can be made.

What is claimed is:

1. A semiconductor device, comprising:
   a semiconductor substrate;
   an integrated circuit structure formed on said semiconductor substrate;
   a multi-layer wiring structure formed above said integrated circuit structure; and
   a number of pads formed on said semiconductor substrate, wherein said multi-layer wiring structure comprises:
   a lower wiring structure;
   an interlayer insulating film covering said lower wiring structure;
   a wiring trench formed in said interlayer insulating film from an upper surface thereof, and a via hole passing through said interlayer insulating film from a lower surface of said wiring trench in an inner area thereof and reaching said lower wiring structure, said via hole having a diameter smaller than a width of said wiring trench;
   an insulating pillar pattern projecting upward from the lower surface of said wiring trench in an area outside of said via hole, the insulating pillar pattern being made of a same material as said interlayer insulating film, wherein a first occupied area factor of said insulating pillar pattern in a first area of said wiring trench near said via hole is higher than a second occupied area factor of said insulating pillar pattern in a second area of said wiring trench remote from said via hole; and
   a dual damascene wiring formed by filling said wiring trench and said via hole with conductive material.

2. A semiconductor device according to claim 1, wherein said plurality of pads include a power supply pad, and said dual damascene wiring is connected to the power supply pad.

3. A damascene wiring structure, comprising:
   a lower wiring structure;
   an interlayer insulating film covering said lower wiring structure;
   a wiring trench formed in said interlayer insulating film from an upper surface thereof, and a via hole passing through said interlayer insulating film from a lower surface of said wiring trench in an inner area thereof and reaching said lower wiring structure, said via hole having a diameter smaller than a width of said wiring trench;
   an insulating pillar pattern projecting upward from the lower surface of said wiring trench in an area outside of said via hole, the insulating pillar pattern being made of a same material as said interlayer insulating film, wherein a first occupied area factor of said insulating pillar pattern in a first area of said wiring trench near said via hole is higher than a second occupied area factor of said insulating pillar pattern in a second area of said wiring trench remote from said via hole; and
   a dual damascene wiring formed by embedding said wiring trench and said via hole with conductive material.

4. A damascene wiring structure according to claim 3, wherein said wiring trench has a width wider than about 2 $\mu$m.

5. A damascene wiring structure according to claim 4, wherein the diameter of said via hole is about 1 $\mu$m or smaller.

6. A damascene wiring structure according to claim 3, wherein said insulating pillar pattern is a plurality of insulating pillars disposed distributively near said via hole.

7. A damascene wiring structure according to claim 6, wherein the first occupied area factor is about 10% or higher.

8. A damascene wiring structure according to claim 7, wherein the first area of said wiring trench near said via hole contains said via hole and is a rectangle area having a side length of 2 $\mu$m.

9. A damascene wiring structure according to claim 7, wherein the first area of said wiring trench near said via hole contains said via hole and is a rectangle area having a side length of 5 $\mu$m.

10. A damascene wiring structure according to claim 6, wherein the plurality of insulating pillars are a plurality of first insulating pillars disposed generally at an equal pitch along at least one loop surrounding said via hole, defining a narrow area of said dual damascene wiring between each pair of adjacent first insulating pillars.

11. A damascene wiring structure according to claim 10, wherein said at least one loop includes four or less loops.

12. A damascene wiring structure according to claim 10, wherein the plurality of insulating pillars includes a plurality of second insulating pillars disposed outside of the plurality of first insulating pillars relative to lengthwise direction of said wiring.

13. A damascene wiring structure according to claim 3, wherein said insulating pillar pattern includes a portion surrounding said via hole excepting a partial area.

14. A damascene wiring structure according to claim 13, wherein said insulating pillar pattern includes a U-character shaped insulating pillar pattern surrounding said via hole, and said dual damascene wiring includes a narrow wiring extending along an opening area of the U-character and a wide wiring connected to the narrow wiring at a position remote from said via hole, the wide wiring having a width wider than the narrow wiring.

15. A damascene wiring structure according to claim 14, wherein the narrow wiring has a width five times the diameter of said via hole or narrower, or about 1 $\mu$m or narrower.

16. A damascene wiring structure according to claim 14, wherein the narrow wiring has a length of 2 $\mu$m or longer from an end of said via hole to the wide wiring.

17. A damascene wiring structure according to claim 13, wherein said insulating pillar pattern includes two insulating pillar stripes disposed to sandwich said via hole.

18. A damascene wiring structure according to claim 17, wherein said dual damascene wiring includes a narrow wiring connected to said via hole and sandwiched between the two insulating pillar stripes and wide wiring connected to the narrow wiring at areas near opposite ends of the two insulating pillar stripes and remote from said via hole, the wide wiring having a width wider than the narrow wiring.

19. A damascene wiring structure according to claim 18, wherein the narrow wiring has a width five times the diameter of said via hole or narrower, or about 1 $\mu$m or narrower.

20. A damascene wiring structure according to claim 18, wherein the narrow wiring has a length of 2 $\mu$m or longer from an end of said via hole to the wide wiring.

* * * * *